(12) United States Patent
Yamada et al.

(10) Patent No.: US 9,588,271 B2
(45) Date of Patent: Mar. 7, 2017

(54) ORGANIC EL DISPLAY ELEMENT HAVING OPTICAL STACK

(71) Applicant: FUJIFILM Corporation, Tokyo (JP)

(72) Inventors: Naoyoshi Yamada, Kanagawa (JP); Yuusuke Furuki, Kanagawa (JP); Jun Watanabe, Kanagawa (JP); Makoto Ishiguro, Kanagawa (JP); Shinpei Yoshida, Kanagawa (JP)

(73) Assignee: FUJIFILM CORPORATION, Tokyo (JP)

( * ) Notice: Subject to any disclaimer, the term of this patent is extended or adjusted under 35 U.S.C. 154(b) by 182 days.

(21) Appl. No.: 14/484,453

(22) Filed: Sep. 12, 2014

(65) Prior Publication Data

US 2014/0375935 A1    Dec. 25, 2014

Related U.S. Application Data

(63) Continuation of application No. PCT/JP2013/057541, filed on Mar. 15, 2013.

(30) Foreign Application Priority Data

Mar. 15, 2012 (JP) ................. 2012-059351
Oct. 4, 2012 (JP) ................. 2012-222480

(51) Int. Cl.
*G02F 1/13363* (2006.01)
*G02B 5/30* (2006.01)
*H01L 51/52* (2006.01)
*G02F 1/1335* (2006.01)

(52) U.S. Cl.
CPC ......... *G02B 5/3016* (2013.01); *G02B 5/3025* (2013.01); *G02F 1/133528* (2013.01); *G02F 1/133602* (2013.01); *G02F 1/133634* (2013.01); *H01L 51/5281* (2013.01); *G02F 2001/133531* (2013.01); *G02F 2001/133635* (2013.01); *G02F 2001/133638* (2013.01)

(58) Field of Classification Search
None
See application file for complete search history.

(56) References Cited

U.S. PATENT DOCUMENTS

2011/0234079 A1    9/2011  Eom et al.
2014/0168769 A1*   6/2014  Seo ................. G02B 5/3083
                                              359/489.07

FOREIGN PATENT DOCUMENTS

JP    07-142170 A    6/1995
JP    09-127885 A    5/1997
JP    09-292522 A    11/1997
(Continued)

OTHER PUBLICATIONS

Office Action issued by JPO on Jan. 6, 2015 in connection with Japanese Patent Application No. 2014-505041.
(Continued)

*Primary Examiner* — Phu Vu
(74) *Attorney, Agent, or Firm* — Jean C. Edwards, Esq.; Edwards Neils LLC

(57) ABSTRACT

An organic EL display device includes at least a polarizer layer, a $\lambda/2$ plate, a $\lambda/4$ plate and an organic EL panel in this order, and an in-plane retardation $Re2(550)$ of the $\lambda/4$ plate at 550 nm satisfies $115 \leq Re2(550) \leq 155$, and an in-plane retardation $Re1(550)$ of the $\lambda/2$ plate at 550 nm satisfies $Re1(550)=2 \times Re2(550) \pm 50$ nm.

29 Claims, 1 Drawing Sheet

(56) References Cited

FOREIGN PATENT DOCUMENTS

| | | |
|---|---|---|
| JP | 2000-056310 A | 2/2000 |
| JP | 2000-104073 A | 4/2000 |
| JP | 2000-105316 A | 4/2000 |
| JP | 2001-004837 A | 1/2001 |
| JP | 2001-155866 A | 6/2001 |
| JP | 2002-098833 A | 4/2002 |
| JP | 2003-332068 A | 11/2003 |
| JP | 2004-053841 A | 2/2004 |
| JP | 2007-108732 A | 4/2007 |
| JP | 2007-188033 A | 7/2007 |
| JP | 2009-139812 A | 6/2009 |
| JP | 2009-244486 A | 10/2009 |
| JP | 4630884 B | 11/2010 |
| JP | 2011-059611 A | 3/2011 |
| JP | 2011-210724 A | 10/2011 |
| WO | 2011/030882 A1 | 3/2011 |

OTHER PUBLICATIONS

Office Action issued by the State Intellectual Property Office of China on Nov. 9, 2015 in connection with Chinese Patent Application No. 201380014240.0.
Office Action issued by the Korean Intellectual Property Office on Nov. 24, 2015 in connection with Korean Patent Application No. 2014-7025436.
International Search Report issued in PCT/JP2013/057541 on Jun. 18, 2013.
Written Opinion issued in PCT/JP2013/057541 on Jun. 18, 2013.

* cited by examiner

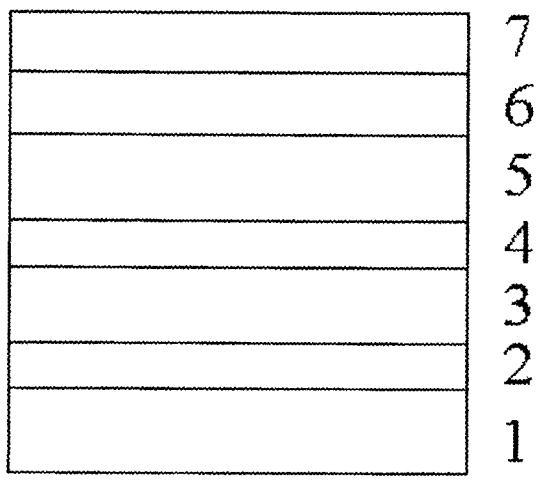

ORGANIC EL DISPLAY ELEMENT HAVING OPTICAL STACK

CROSS REFERENCE TO RELATED APPLICATION

This is a continuation of International Application No. PCT/JP2013/057541 filed on Mar. 15, 2013, which was published under PCT Article 21(2) in Japanese, and claims priority from Japanese Patent Application No. 2012-059351 filed on Mar. 15, 2012 and Japanese Patent Application No. 2012-222480 filed on Oct. 4, 2012, the entire disclosures of which are incorporated herein by reference in their entirety.

TECHNICAL FIELD

The present invention relates to an organic electroluminescence (hereinafter, referred to as "organic EL") display device having an optical stack.

BACKGROUND ART

The organic electroluminescence (organic EL) display device is a thin display device of self-emission type, and has an advantage in view of display performance, for example, high visibility or small viewing angle dependency, in comparison with a liquid crystal display device. Also, in addition to an advantage in that the display can be made lighter and thinner, it has a possibility of achieving a display device having a shape, which has not been realized, by using a flexible substrate.

The organic EL display device has the excellent features as described above. However, since layers having different refractive indexes are stacked using a transparent conductive material having a high refractive index, for example, ITO, as an electrode and a metal material having a high reflectance are used, external light is reflected at the interfaces thereof, thereby causing a problem of reduction of contrast or background reflections due to internal reflection.

A typical constitution of the organic EL element is shown in FIG. 1. As shown in FIG. 1, the organic EL display device basically has a constitution in which on a TFT substrate 1, a back electrode 2, an organic layer 3 made from two or three layers including a light emitting layer, a transparent electrode or translucent electrode 4 and a transparent substrate 5 are stacked, and a positive hole injected from the back electrode 2 and an electron injected from the transparent electrode 4 are recombined in the organic layer 3 to excite a fluorescent substance or the like, thereby emitting light. The light emitted from the organic layer 3 is emitted through the transparent substrate 5 directly or after being reflected with the back electrode 2 formed from aluminum or the like. Also, in order to realize color display, for instance, a construction wherein the organic layer 3 has a structure in which pixels of three colors in total, red, green and blue, or pixels of four colors in total including white in addition to three colors are arranged in a matrix form, and a structure in which the organic layer 3 is made from an element emitting white light and is combined with a color filter to achieve a color display are proposed (for example, Patent Documents 1 and 2).

As described above, since the organic EL element has a structure in that plural layers having different refractive indexes are stacked or in that a metal electrode is used, external light is reflected at the interfaces of the respective layers to cause the problem of reduction of contrast or background reflections.

In order to inhibit the harmful influence due to the external light reflection as described above, a proposal of using an absorption type linear polarizing plate and a circular polarizing plate made from a λ/4 plate (for example, Patent Documents 3, 4, 5 and 6) and a proposal of using an absorption type linear polarizing plate, a λ/2 plate and a circular polarizing plate made from a λ/4 plate (for example, Patent Document 7) have been made.

Further, the circular polarizing plate has a large number of uses not only in the organic EL display device but also in a reflection type LCD, a semi-transmission type LCD, a transparent display, a brightness enhancement film, a pick-up for optical disc, a PS conversion element and the like.

PRIOR ART DOCUMENT

Patent Document

Patent Document 1: Japanese Patent No. 4630884
Patent Document 2: JP-A-2011-59611
Patent Document 3: JP-A-7-142170
Patent Document 4: JP-A-9-127885
Patent Document 5: JP-A-2003-332068
Patent Document 6: JP-A-2002-98833
Patent Document 7: JP-A-2007-188033
Patent Document 8: JP-A-2001-4837
Patent Document 9: JP-A-2004-53841
Patent Document 10: JP-A-9-292522
Patent Document 11: JP-A-2000-56310
Patent Document 12: JP-A-2000-104073
Patent Document 13: JP-A-2000-105316
Patent Document 14: JP-A-2007-108732

DISCLOSURE OF THE INVENTION

Problems that the Invention is to Solve

The λ/4 plate or λ/2 plate is required that the slow axis thereof is set at an angle which is neither parallel nor orthogonal to the absorption axis of the polarizing plate. Most of the λ/4 plates or λ/2 plates currently used are retardation plates which exhibit optical anisotropy by stretching a polymer film, and the slow axis direction of the polymer film ordinarily corresponds to a vertical direction or a horizontal direction of sheet-shaped or roll-shaped film. On the other hand, since the absorption axis of the polarizing plate is parallel to the longitudinal direction of a roll-shaped film, in order to stick the λ/4 plate or λ/2 plate to the polarizing plate, it is needed that the respective films are cut and the resulting chips are stuck so as to have a predetermined angle. For the production of a stack of the retardation plate and the polarizing plate by the sticking of the chips, a coating process of an adhesive and a process of chip cut and sticking of chips are necessary and there are problems in that the procedures are troublesome, degradation of quality due to axis misalignment is apt to occur, yield decreases, cost increases and incorporation of foreign matter is apt to occur.

Also, the polymer film having the slow axis in an oblique direction of the sheet-shaped or roll-shaped film has a problem in that the production thereof is very difficult.

Moreover, the polymer film has a problem in that the retardation thereof may change according to the variation of temperature or humidity and the desired performance cannot be obtained in some cases.

In order to solve the problems, a retardation plate having a slow axis in a direction which is neither parallel nor orthogonal with respect to a roll-shaped film produced by coating a coating solution containing a discotic liquid crystal compound or a rod-like liquid crystal compound on the roll-shaped film and orienting the liquid crystal compound in a predetermined direction to exhibit optical anisotropy is proposed (Patent Documents 8 and 9). Also, a retardation plate in which a discotic plane of discotic liquid crystal molecule is oriented and fixed so as to be substantially vertical with respect to the film plane is disclosed (Patent Documents 10, 11, 12, 13 and 14).

However, the circular polarizing plate produced according to the patent documents described above has a problem in that the reflection when viewed from an oblique direction cannot be reduced sufficiently and the viewing angle characteristic is poor in some cases.

The present invention has been made to solve the problems described above, and an object of the invention is to provide an organic EL display device excellent in the viewing angle characteristic in a high productivity.

Means for Solving the Problems (1) An organic EL display device provided with at least a polarizer layer, a λ/2 plate, a λ/4 plate and an organic EL panel in this order, wherein an in-plane retardation Re2(550) of the λ/4 plate at 550 nm satisfies $$115 \leq Re2(550) \leq 155,$$

and an in-plane retardation Re1(550) of the λ/2 plate at 550 nm satisfies $$Re1(550)=2 \times Re2(550) \pm 50 \text{ nm}.$$

(2) The organic EL display device as described in (1), wherein an angle formed between an absorption axis direction of the polarizer layer and a slow axis direction of the λ/2 plate is in a range of $$-30° \times Rth1(550)/|Rth1(550)|+45° \pm 8°,$$

and an angle formed between the absorption axis direction of the polarizer layer and a slow axis direction of the λ/4 plate is in a range of $$30° \times Rth1(550)/|Rth1(550)|+45° \pm 8°,$$

wherein Rth1(550) represents a retardation in a thickness direction at a wavelength of 550 nm.

(3) The organic EL display device as described in (2), wherein at least one of the λ/2 plate and the λ/4 plate is a layer containing either a discotic liquid crystal compound or a rod-like liquid crystal compound.

(4) The organic EL display device as described in (3), wherein among layers from the polarizer layer to the λ/2 plate, a sum of Rth at a wavelength of 550 nm of all layers including the λ/2 plate and not including the polarizer layer is from −150 to 150 nm, and among layers from the λ/2 plate to the λ/4 plate, a sum of Rth at a wavelength of 550 nm of all layers including the λ/4 plate and not including the λ/2 plate is from −120 to 120 nm.

(5) The organic EL display device as described in (4), which is provided with at least the polarizer layer, a first transparent support layer made from at least one layer, the λ/2 plate made from a layer containing a discotic liquid crystal compound, a second transparent support layer made from at least one layer, the λ/4 plate made from a layer containing a discotic liquid crystal compound and the organic EL panel in this order, wherein Rth of the first transparent support layer at a wavelength of 550 nm is from −30 to 150 nm, and Rth of the second transparent support layer at a wavelength of 550 nm is from 0 to 200 nm.

(6) The organic EL display device as described in (4), which is provided with at least the polarizer layer, the λ/2 plate made from a layer containing a discotic liquid crystal compound, a transparent support layer made from at least one layer, the λ/4 plate made from a layer containing a discotic liquid crystal compound and the organic EL panel in this order, wherein Rth of the transparent support layer at a wavelength of 550 nm is from −10 to 140 nm.

(7) The organic EL display device as described in (4), which is provided with at least the polarizer layer, a transparent support layer made from at least one layer, the λ/2 plate made from a layer containing a discotic liquid crystal compound, the λ/4 plate made from a layer containing a discotic liquid crystal compound and the organic EL panel in this order, wherein Rth of the transparent support layer at a wavelength of 550 nm is from −30 to 30 nm.

(8) The organic EL display device as described in (4), which is provided with at least the polarizer layer, the λ/2 plate made from a layer containing a discotic liquid crystal compound, the λ/4 plate made from a layer containing a discotic liquid crystal compound, a transparent support layer made from at least one layer and the organic EL panel in this order, wherein Rth of the transparent support layer at a wavelength of 550 nm is from −10 to 100 nm.

(9) The organic EL display device as described in (4), which is provided with at least the polarizer layer, a transparent support layer made from at least one layer, the λ/2 plate made from a layer containing a discotic liquid crystal compound, the λ/4 plate made from a layer containing a rod-like liquid crystal compound and the organic EL panel in this order, wherein Rth of the transparent support layer at a wavelength of 550 nm is from −50 to 150 nm.

(10) The organic EL display device as described in (4), which is provided with at least the polarizer layer, the λ/2 plate made from a layer containing a discotic liquid crystal compound, a transparent support layer made from at least one layer, the λ/4 plate made from a layer containing a rod-like liquid crystal compound and the organic EL panel in this order, wherein Rth of the transparent support layer at a wavelength of 550 nm is from −90 to 50 nm.

(11) The organic EL display device as described in (4), which is provided with at least the polarizer layer, the λ/2 plate made from a layer containing a discotic liquid crystal compound, the λ/4 plate made from a layer containing a rod-like liquid crystal compound, a transparent support layer made from at least one layer and the organic EL panel in this order, wherein Rth of the transparent support layer at a wavelength of 550 nm is from −110 to 40 nm.

(12) The organic EL display device as described in (4), which is provided with at least the polarizer layer, a first transparent support layer made from at least one layer, the λ/2 plate made from a layer containing a discotic liquid crystal compound, a second transparent support layer made from at least one layer, the λ/4 plate made from a layer containing a rod-like liquid crystal compound and the organic EL panel in this order, wherein Rth of the first transparent support layer at a wavelength of 550 nm is from −40 to 140 nm, and Rth of the second transparent support layer at a wavelength of 550 nm is from −70 to 70 nm.

(13) The organic EL display device as described in (4), which is provided with at least the polarizer layer, a first transparent support layer made from at least one layer, the λ/2 plate made from a layer containing a discotic liquid crystal compound, the λ/4 plate made from a layer containing a discotic liquid crystal compound, a second transparent support layer made from at least one layer and the organic EL panel in this order, wherein Rth of the first transparent support layer at a wavelength of 550 nm is from −50 to 130 nm, and Rth of the second transparent support layer at a wavelength of 550 nm is from 0 to 100 nm.

(14) The organic EL display device as described in (4), which is provided with at least the polarizer layer, a first transparent support layer made from at least one layer, the λ/2 plate made from a layer containing a discotic liquid crystal compound, the λ/4 plate made from a layer containing a rod-like liquid crystal compound, a second transparent support layer made from at least one layer and the organic EL panel in this order, wherein Rth of the first transparent support layer at a wavelength of 550 nm is from −40 to 140 nm, and Rth of the second transparent support layer at a wavelength of 550 nm is from −100 to 40 nm.

(15) The organic EL display device as described in (4), which is provided with at least the polarizer layer, the λ/2 plate made from a layer containing a discotic liquid crystal compound, a first transparent support layer made from at least one layer, the λ/4 plate made from a layer containing a discotic liquid crystal compound, a second transparent support layer made from at least one layer and the organic EL panel in this order, wherein Rth of the first transparent support layer at a wavelength of 550 nm is from −40 to 150 nm, and Rth of the second transparent support layer at a wavelength of 550 nm is from −50 to 100 nm.

(16) The organic EL display device as described in (4), which is provided with at least the polarizer layer, the λ/2 plate made from a layer containing a discotic liquid crystal compound, a first transparent support layer made from at least one layer, the λ/4 plate made from a layer containing a rod-like liquid crystal compound, a second transparent support layer made from at least one layer and the organic EL panel in this order, wherein Rth of the first transparent support layer at a wavelength of 550 nm is from −70 to 100 nm, and Rth of the second transparent support layer at a wavelength of 550 nm is from −110 to 40 nm.

(17) The organic EL display device as described in (4), which is provided with at least the polarizer layer, a transparent support layer made from at least one layer, the λ/2 plate made from a layer containing a rod-like liquid crystal compound, the λ/4 plate made from a layer containing a discotic liquid crystal compound and the organic EL panel in this order, wherein Rth of the transparent support layer at a wavelength of 550 nm is from −150 to 50 nm.

(18) The organic EL display device as described in (4), which is provided with at least the polarizer layer, a transparent support layer made from at least one layer, the λ/2 plate made from a layer containing a rod-like liquid crystal compound, the λ/4 plate made from a layer containing a rod-like liquid crystal compound and the organic EL panel in this order, wherein Rth of the transparent support layer at a wavelength of 550 nm is from −30 to 30 nm.

(19) The organic EL display device as described in (4), which is provided with at least the polarizer layer, the λ/2 plate made from a layer containing a rod-like liquid crystal compound, a transparent support layer made from at least one layer, the λ/4 plate made from a layer containing a discotic liquid crystal compound and the organic EL panel in this order, wherein Rth of the transparent support layer at a wavelength of 550 nm is from −50 to 90 nm.

(20) The organic EL display device as described in (4), which is provided with at least the polarizer layer, the λ/2 plate made from a layer containing a rod-like liquid crystal compound, a transparent support layer made from at least one layer, the λ/4 plate made from a layer containing a rod-like liquid crystal compound and the organic EL panel in this order, wherein Rth of the transparent support layer at a wavelength of 550 nm is from −140 to 10 nm.

(21) The organic EL display device as described in (4), which is provided with at least the polarizer layer, the λ/2 plate made from a layer containing a rod-like liquid crystal compound, the λ/4 plate made from a layer containing a discotic liquid crystal compound, a transparent support layer made from at least one layer and the organic EL panel in this order, wherein Rth of the transparent support layer at a wavelength of 550 nm is from −50 to 110 nm.

(22) The organic EL display device as described in (4), which is provided with at least the polarizer layer, the λ/2 plate made from a layer containing a rod-like liquid crystal compound, the λ/4 plate made from a layer containing a rod-like liquid crystal compound, a transparent support layer made from at least one layer and the organic EL panel in this order, wherein Rth of the transparent support layer at a wavelength of 550 nm is from −100 to 10 nm.

(23) The organic EL display device as described in (4), which is provided with at least the polarizer layer, a first transparent support layer made from at least one layer, the λ/2 plate made from a layer containing a rod-like liquid crystal compound, a second transparent support layer made from at least one layer, the λ/4 plate made from a layer containing a discotic liquid crystal compound and the organic EL panel in this order, wherein Rth of the first transparent support layer at a wavelength of 550 nm is from −140 to 40 nm, and Rth of the second transparent support layer at a wavelength of 550 nm is from −70 to 70 nm.

(24) The organic EL display device as described in (4), which is provided with at least the polarizer layer, a first transparent support layer made from at least one layer, the λ/2 plate made from a layer containing a rod-like liquid crystal compound, a second transparent support layer made from at least one layer, the λ/4 plate made from a layer containing a rod-like liquid crystal compound and the organic EL panel in this order, wherein Rth of the first transparent support layer at a wavelength of 550 nm is from −150 to 40 nm, and Rth of the second transparent support layer at a wavelength of 550 nm is from −200 to 0 nm.

(25) The organic EL display device as described in (4), which is provided with at least the polarizer layer, a first transparent support layer made from at least one layer, the λ/2 plate made from a layer containing a rod-like liquid crystal compound, the λ/4 plate made from a layer containing a discotic liquid crystal compound, a second transparent support layer made from at least one layer and the organic EL panel in this order, wherein Rth of the first transparent support layer at a wavelength of 550 nm is from −140 to 40 nm, and Rth of the second transparent support layer at a wavelength of 550 nm is from −40 to 100 nm.

(26) The organic EL display device as described in (4), which is provided with at least the polarizer layer, a first transparent support layer made from at least one layer, the λ/2 plate made from a layer containing a rod-like liquid crystal compound, the λ/4 plate made from a layer containing a rod-like liquid crystal compound, a second transparent support layer made from at least one layer and the organic EL panel in this order, wherein Rth of the first transparent support layer at a wavelength of 550 nm is from −120 to 40 nm, and Rth of the second transparent support layer at a wavelength of 550 inn is from −100 to 0 nm.

(27) The organic EL display device as described in (4), which is provided with at least the polarizer layer, the λ/2 plate made from a layer containing a rod-like liquid crystal compound, a first transparent support layer made from at least one layer, the λ/4 plate made from a layer containing a discotic liquid crystal compound, a second transparent support layer made from at least one layer and the organic EL panel in this order, wherein Rth of the first transparent support layer at a wavelength of 550 nm is from −100 to 80 nm, and Rth of the second transparent support layer at a wavelength of 550 nm is from −40 to 100 nm.

(28) The organic EL display device as described in (4), which is provided with at least the polarizer layer, the λ/2 plate made from a layer containing a rod-like liquid crystal compound, a first transparent support layer made from at least one layer, the λ/4 plate made from a layer containing a rod-like liquid crystal compound, a second transparent support layer made from at least one layer and the organic EL panel in this order, wherein Rth of the first transparent support layer at a wavelength of 550 nm is from −150 to 40 nm, and Rth of the second transparent support layer at a wavelength of 550 nm is from −100 to 50 nm.

(29) The organic EL display device as described in any one of (1) to (28), which includes at least one cellulose acylate layer between the polarizer layer and the organic EL panel.

In the specification, the description of "A to B" represents the meaning of "A or more and B or less". Also, "organic EL" means organic electroluminescence.

Also, in the specification, a "slow axis" means a direction in which the refractive index is the largest in the plane. Unless otherwise specifically indicated, the measurement wavelength of the refractive index is in a visible light region (λ=550 nm).

Advantage of the Invention

According to the invention, an organic EL display device in which the background reflections of reflected image due to internal reflection of the organic EL element is sufficiently reduced not only in the front direction but also in an oblique direction and which is excellent in the display performance, productivity and durability can be provided.

transparent protective layer on at least one surface of the "polarizing film" for protecting the polarizing film.

In the specification, Re(λ) and Rth(λ) represent in-plane retardation and retardation in a thickness direction at a wavelength λ, respectively. The Re(λ) is measured by making light having a wavelength λ nm incident in a normal direction of the film using KOBRA 21ADH or WR (produced by Oji Scientific Instruments). In the selection of the measurement wavelength λ nm, the measurement may be conducted according to manual exchange of a wavelength selective filter or according to conversion of a measurement value by a program or the like. In the case where the film to be measured is expressed by a uniaxial or biaxial refractive index ellipsoid, the Rth(λ) is calculated in the manner described below.

Six Re(λ) values are measured such that light having a wavelength λ nm is made incident to the film from six directions inclined to 50° on one side at intervals of 10° to the film normal direction using an in-plane slow axis (decided by KOBRA 21ADH or WR) as an inclination axis (rotation axis) (in the case where the film has no slow axis, an arbitrary in-plane direction of film is used as the rotation axis), and the Rth(λ) is calculated by KOBRA 21ADH or WR based on the six Re(λ) values measured, a hypothetical value of the average refractive index and a thickness value of the film inputted. In the above, in the case of film having a direction in which the retardation value measured using the in-plane slow axis as the rotation axis is zero at a certain inclination angle to the normal direction, the sign of a retardation value at the inclination angle larger than the inclination angle to give a zero retardation is changed to a negative sign, and then the negative retardation value is used in the calculation by KOBRA 21ADH or WR. The Rth value can also calculated according to formula (A) and formula (III) shown below based on two retardation values measured in arbitrary two inclined directions using the slow axis as the inclination axis (rotation axis) (in the case where the film has no slow axis, an arbitrary in-plane direction is used as the rotation axis), a hypothetical value of the average refractive index, and a thickness value of the film inputted.

$$Re(\theta) = \left[nx - \frac{(ny \times nz)}{\sqrt{\left(ny\sin\left(\sin^{-1}\left(\frac{\sin(-\theta)}{nx}\right)\right)\right)^2 + \left(nz\cos\left(\sin^{-1}\left(\frac{\sin(-\theta)}{nx}\right)\right)\right)^2}}\right] \times \frac{d}{\cos\left(\sin^{-1}\left(\frac{\sin(-\theta)}{nx}\right)\right)}$$

Formula (A)

BRIEF DESCRIPTION OF THE DRAWING

FIG. 1 is a schematic drawing of an organic EL display device.

MODE FOR CARRYING OUT THE INVENTION

The invention will be described in detail below.

In the description of the embodiment, the term "polarizing plate", unless otherwise specifically indicated, means and includes a long polarizing plate and a polarizing plate cut to a size incorporated into the display device. The term "cut" as used herein includes, for example, "punch" and "clip". In the description of the embodiment, the terms "polarizing film" and "polarizing plate" are discriminated from each other, and the "polarizing plate" means a stack having a In the formulae above, Re(θ) represents a retardation value in the direction inclined at an angle θ to a normal direction, nx represents a refractive index in a slow axis direction in the plane, ny represents a refractive index in a direction orthogonal to nx in the plane, nz represents a refractive index in the direction orthogonal to nx and ny. d represents a film thickness.

$Rth=((nx+ny)/2-nz)\times d$  Formula (III)

In the case where the film to be measured cannot be expressed by a uniaxial or biaxial index ellipsoid, specifically, in the case where the film to be measured has no so-called optical axis (optic axis), Rth (λ) is calculated in the manner described below. Eleven Re(λ) values are measured such that light having a wavelength λ nm is made incident to the film from eleven directions inclined from −50° to +50° at intervals of 10° to the film normal direction using an in-plane slow axis (decided by KOBRA 21ADH or WR), as an inclination axis (rotation axis), and the Rth(λ) is calculated by KOBRA 21ADH or WR based on the eleven Re(λ) values measured, a hypothetical value of the average refractive index and a thickness value of the film inputted. In the measurement described above, as the hypothetical value of the average refractive index, values described in *Polymer Handbook* (JOHN WILEY & SONS, INC.) and catalogs of various optical films can be used. In the case where a value of average refractive index is unknown, the value can be measured by an Abbe refractometer. The average refractive indexes of major optical films are shown below: cellulose acylate (1.48), cycloolefin polymer (1.52), polycarbonate (1.59), polymethyl methacrylate (1.49), and polystyrene (1.59). By inputting the hypothetical value of the average refractive index and the film thickness, nx, ny and nz are calculated by KOBRA 21ADH or KOBRA WR. On the basis of the nx, ny and nz thus-calculated, Nz=(nx−nz)/(nx−ny) is further calculated.

Hereinafter, various materials utilized for the production of the organic EL display device according to the invention, the production method and the like are described in detail. In the specification, the optical film has the same meaning as the optically anisotropic layer.

[Optically Anisotropic Layer]

The optically anisotropic layer which can be used in the invention including the λ/2 plate and the λ/4 plate is described below.

The λ/4 plate for use in the invention may be an optically anisotropic support itself which has the desired λ/4 function or may have a constitution in which an optically anisotropic layer and the like are provided on a support made from a polymer film. Specifically, in the latter case, the desired λ/4 function is imparted by stacking other layer on the support. A material for constituting the optically anisotropic layer is not particularly limited. The optically anisotropic layer may be a layer formed from a composition containing a liquid crystalline compound and exhibiting the optical anisotropy expressed by orientation of molecules of the liquid crystalline compound, may be a layer formed by stretching a polymer film and exhibiting the optical anisotropy expressed by orienting polymers in the polymer film, or may have both the two layers. Specifically, the optically anisotropic layer may be constituted by one or two or more biaxial films or may be constituted by combining two or more monoaxial films, for example, a combination of a C plate and an A plate. Of course, it may be constituted by a combination of one or more biaxial films and one or more monoaxial films.

The term "λ/4 plate" means an optically anisotropic layer in which an in-plane retardation Re(λ) at a specific wavelength of λ nm satisfies a formula Re(λ)=λ/4. It is only necessary that the formula is achieved at any wavelength (for example, 550 nm) in the visible region, and in-plane retardation Re(550) at a wavelength of 550 nm satisfies preferably 115 nm≤Re(550)≤155 nm, and is more preferably from 120 to 145 nm. The range described above is preferred because the light leakage due to reflected light can be reduced to an invisible extent in the case of combining the λ/4 plate with the λ/2 plate described below.

The λ/2 plate for use in the invention may be an optically anisotropic support itself which has the desired λ/2 function or may have a constitution in which an optically anisotropic layer and the like are provided on a support made from a polymer film. Specifically, in the latter case, the desired λ/4 function is imparted by stacking other layer on the support. A material for constituting the optically anisotropic layer is not particularly limited. The optically anisotropic layer may be a layer formed from a composition containing a liquid crystalline compound and exhibiting the optical anisotropy expressed by orientation of molecules of the liquid crystalline compound, may be a layer formed by stretching a polymer film and exhibiting the optical anisotropy expressed by orienting polymers in the polymer film, or may have both the two layers. Specifically, the optically anisotropic layer may be constituted by one or two or more biaxial films or may be constituted by combining two or more monoaxial films, for example, a combination of a C plate and an A plate. Of course, it may be constituted by a combination of one or more biaxial films and one or more monoaxial films.

The term "λ/2 plate" means an optically anisotropic layer in which an in-plane retardation Re(λ) at a specific wavelength of λ nm satisfies a formula Re(λ)=λ/2. It is only necessary that the formula is achieved at any wavelength (for example, 550 nm) in the visible region. Further, in the invention, the in-plane retardation Re1 of the λ/2 plate is set to be substantially twice the in-plane retardation Re2 of the λ/4 plate. The term "retardation is substantially twice" as used herein means that Re1=2×Re2±50 nm. It is more preferably that Re1=2×Re2±20 nm, and still more preferably that Re1=2×Re2±10 nm. It is only necessary that the formula is achieved at any wavelength in the visible region, it is preferred to achieve at a wavelength of 550 nm. The range described above is preferred because the light leakage due to reflected light can be reduced to an invisible extent in the case of combining the λ/2 plate with the λ/4 plate described above.

In the case where the Rth of the λ/2 plate at a wavelength of 550 nm is a negative value, an angle formed between the slow axis direction of the λ/2 plate and the absorption axis of the polarizer layer is preferably in a range of 75°±8°, more preferably in a range of 75°±6°, and still more preferably in a range of 75°±3°. Moreover, in this case, an angle formed between the slow axis direction of the λ/4 plate and the absorption axis of the polarizer layer is preferably in a range of 15°±8°, more preferably in a range of 15°±6°, and still more preferably in a range of 15°±3°. The range described above is preferred because the light leakage due to reflected light can be reduced to an invisible extent.

In the case where the Rth of the λ/2 plate at a wavelength of 550 nm is a positive value, an angle formed between the slow axis direction of the λ/2 plate and the absorption axis of the polarizer layer is preferably in a range of 15°±8°, more preferably in a range of 15°±6°, and still more preferably in a range of 15°±3°. Moreover, in this case, an angle formed between the slow axis direction of the λ/4 plate and the absorption axis of the polarizer layer is preferably in a range of 75°±8°, more preferably in a range of 75°±6°, and still more preferably in a range of 75°±3°. The range described above is preferred because the light leakage due to reflected light can be reduced to an invisible extent.

A material of the optically anisotropic support for use in the invention is not particularly limited. Various kinds of polymers, for instance, a cellulose acylate, a polycarbonate polymer, a polyester polymer, for example, polyethylene terephthalate or polyethylene naphthalate, an acrylic polymer, for example, polymethyl methacrylate, and a styrene polymer, for example, polystyrene or an acrylonitrile-styrene copolymer (AS resin) can be utilized. Also, one kind or two or more kinds of polymers are selected from a polyolefin, for example, polyethylene or polypropylene, a polyolefin polymer, for example, an ethylene-propylene copolymer, a vinyl chloride polymer, an amide polymer, for example, nylon or an aromatic polyamide, an imide polymer, a sulfone polymer, a polyether sulfone polymer, a polyether ether ketone polymer, a polyphenylene sulfide polymer, a vinylidene chloride polymer, a vinyl alcohol polymer, a vinyl butyral polymer, an arylate polymer, a polyoxymethylene polymer, an epoxy polymer, and a mixture of the polymers described above and used as the main component to produce a polymer film, thereby utilizing for the production of the optical film in the combination which satisfies the characteristics described above.

In the case where the λ/2 plate or the λ/4 plate is a stack of a polymer film (transparent support) and an optically anisotropic layer, the optically anisotropic layer is preferably includes at least one layer formed from a composition containing a liquid crystalline compound. Specifically, it is preferably a stack of a polymer film (transparent support) and an optically anisotropic layer formed from a composition containing a liquid crystalline compound. As the transparent support, a polymer film having a small optical anisotropy may be used or a polymer film exhibiting the optical anisotropy by a stretching treatment or the like may be used. The support preferably has a light transmittance of 80% or more.

[Optically Anisotropic Layer Containing Liquid Crystalline Compound]

A kind of the liquid crystalline compound used for the formation of the optically anisotropic layer which the λ/2 plate or the λ/4 plate may have is not particularly limited. For example, an optically anisotropic layer obtained by forming a low molecular liquid crystalline compound in the nematic orientation in a liquid crystal state and then fixing by photo-crosslinking or thermal crosslinking, or an optically anisotropic layer obtained by forming a high molecular liquid crystalline compound in the nematic orientation in a liquid crystal state and then cooling to fix the orientation can also be used. In the invention, even when a liquid crystalline compound is used in the optically anisotropic layer, the optically anisotropic layer is a layer formed by fixing the liquid crystalline compound by polymerization or the like and thus does not need any more to exhibit liquid crystallinity once the layer is formed. A polymerizable liquid crystalline compound may be a multifunctional polymerizable liquid crystalline compound or a monofunctional polymerizable liquid crystalline compound. Also, the liquid crystalline compound may be a discotic liquid crystalline compound or a rod-like liquid crystalline compound.

In general, the liquid crystal compounds are classified into a rod-like type and a discotic type based on the shape thereof. Further, each type includes a low molecular type and a high molecular type. The "high molecular type" commonly means a polymer having a degree of polymerization of 100 or more (Masao Doi, Kobunshi Butsuri Soten-i Dynamics (Polymer Physics•Phase Transition Dynamics), page 2, Iwanami Shoten, Publishers (1992). In the invention, any liquid crystal compound can be used, and a rod-like liquid crystal compound or a discotic liquid crystal compound is preferably used. Two or more rod-like liquid crystal compounds, two or more discotic liquid crystal compounds, or a mixture of a rod-like liquid crystal compound and a discotic liquid crystal compound may be used. From the standpoint of reducing changes depending on temperature and humidity, the layer is more preferably formed using a rod-like liquid crystal compound having a reactive group or a discotic liquid crystal compound having a reactive group. Still more preferably, at least one liquid crystal compound has two or more reactive groups in one liquid crystal molecule. A mixture of two or more liquid crystal compounds may be used. In such a case, at least one liquid crystal compound preferably has two or more reactive groups.

As the rod-like liquid crystal compound, for example, those described in JP-T-11-513019 and JP-A-2007-279688 are preferably used. As the discotic liquid crystal compound, for example, those described in JP-A-2007-108732 and JP-A-2010-244038 are preferably used. However, the invention should not be construed as being limited to those described above.

It is preferred that a molecule of the liquid crystal compound is fixed in any one of the orientation state of a vertical orientation, a parallel orientation, a hybrid orientation and an oblique orientation. In order to produce a retardation plate having a symmetric viewing angle dependency, it is preferred that the disc plane of discotic liquid crystalline compound is substantially vertical to the film plane (optically anisotropic layer plane) or the major axis of rod-like liquid crystalline compound is substantially parallel to the film plane (optically anisotropic layer plane). The term "discotic liquid crystalline compound is substantially vertical" as used herein means that an average value of an angle formed between the film plane (optically anisotropic layer plane) and the disc plane of discotic liquid crystalline compound is in a range from 70 to 90°. The average value is more preferably from 80 to 90°, and still more preferably from 85 to 90°. The teen "rod-like liquid crystalline compound is substantially parallel" as used herein means that an angle formed between the film plane (optically anisotropic layer plane) and the director of rod-like liquid crystalline compound is in a range from 0 to 20°. The angle is more preferably from 0 to 10°, and still more preferably from 0 to 5°.

In the case where the λ/2 plate or the λ/4 plate includes an optically anisotropic layer containing a liquid crystalline compound, the optically anisotropic layer may be made from only one layer or a stack of two or more optically anisotropic layers.

The optically anisotropic layer can be formed by coating on a support a coating solution containing a liquid crystalline compound, for example, a rod-like liquid crystalline compound or a discotic liquid crystalline compound and, if desired, a polymerization initiator, an orientation controlling agent and other additives. It is preferably formed by providing an oriented film on the support and coating the coating solution on the surface of the oriented film.

[Oriented Film]

In the invention, it is preferred to coat the composition described above on the surface of the oriented film and to orient the molecule of the liquid crystalline compound. Since the oriented film has a function of defining the orientation direction of the liquid crystalline compound, it is preferred to utilize it in view of realizing the preferred embodiment of the invention. However, once the liquid crystalline compound is fixed in the orientation state after the orientation, the oriented film has completed its function, and hence it is not always necessary as the constituent element of the invention. That is, it is possible to transfer only an optically anisotropic layer having a fixed orientation state on an oriented film onto a polarizing layer or a support, thereby producing the polarizing plate according to the invention.

The oriented film is preferably formed by a rubbing treatment of a polymer.

Examples of the polymer include a methacrylate copolymer described in Paragraph No. of JP-A-8-338913, a styrene copolymer, a polyolefin, polyvinyl alcohol and a modified polyvinyl alcohol, poly(N-methylolacrylamide), a polyester, a polyimide, a vinyl acetate copolymer, carboxymethyl cellulose and a polycarbonate. A silane coupling agent may be used as the polymer. A water-soluble polymer (for example, poly(N-methylolacrylamide), carboxymethyl cellulose, gelatin, polyvinyl alcohol or a modified polyvinyl alcohol) is preferred, gelatin, polyvinyl alcohol and a modified polyvinyl alcohol are more preferred, and polyvinyl alcohol and a modified polyvinyl alcohol are most preferred. To the rubbing treatment can be applied a treatment method which is widely adopted as a liquid crystal orientation treatment process of LCD. Specifically, a method of obtaining orientation by rubbing the surface of the oriented film in a definite direction with paper, gauze, felt, rubber, nylon, a polyester fiber or the like can be used. It is commonly performed by rubbing approximately several times using, for example, a cloth on which fibers of uniform length and width have been implanted uniformly.

The composition described above is coated on the rubbing treatment surface of the oriented film to orient the molecule of the liquid crystalline compound. Thereafter, if desired, the polymer of the oriented film is reacted with a polyfunctional monomer contained in the optically anisotropic layer or the polymer of the oriented film is crosslinked using a crosslinking agent to form the optically anisotropic layer.

The thickness of the oriented film is preferably in a range from 0.1 to 10 µm.

[Transparent Support (Polymer Film)]

Hereinafter, unless otherwise particularly defined, Re and Rth indicate the values at a wavelength of 550 nm, respectively.

The in-plane retardation (Re) of the transparent support (polymer film) supporting the optically anisotropic layer is preferably from 0 to 50 nm, more preferably from 0 to 30 nm, and still more preferably from 0 to 10 nm. The range described above is preferred because the light leakage due to reflected light can be reduced to an invisible extent.

The retardation in a thickness direction (Rth) of the support is preferably selected in view of a combination with the optically anisotropic layer provided thereon or thereunder. Thus, the light leakage due to reflected light and tinting when observed from an oblique direction can be reduced.

In the case of the organic EL display device provided with at least a polarizer layer, a first transparent support layer made from at least one layer, a λ/2 plate made from a layer containing a discotic liquid crystal compound, a second transparent support layer made from at least one layer, a λ/4 plate made from a layer containing a discotic liquid crystal compound and an organic EL panel in this order, Rth of the first transparent support layer is preferably from −30 to 150 nm, more preferably from 30 to 120 nm, and still more preferably from 60 to 90 nm. Also, Rth of the second transparent support layer is preferably from 0 to 200 nm, more preferably from 50 to 150 nm, and still more preferably from 90 to 130 nm.

In the case of the organic EL display device provided with at least a polarizer layer, a λ/2 plate made from a layer containing a discotic liquid crystal compound, a transparent support layer made from at least one layer, a λ/4 plate made from a layer containing a discotic liquid crystal compound and an organic EL panel in this order, Rth of the transparent support layer is preferably from −10 to 140 nm, more preferably from 10 to 120 nm, and still more preferably from 40 to 80 nm.

In the case of the organic EL display device provided with at least a polarizer layer, a transparent support layer made from at least one layer, a λ/2 plate made from a layer containing a discotic liquid crystal compound, a λ/4 plate made from a layer containing a discotic liquid crystal compound and an organic EL panel in this order, Rth of the transparent support layer is preferably from −30 to 30 nm, and more preferably from −20 to 10 nm.

In the case of the organic EL display device provided with at least a polarizer layer, a λ/2 plate made from a layer containing a discotic liquid crystal compound, a λ/4 plate made from a layer containing a discotic liquid crystal compound, a transparent support layer made from at least one layer and an organic EL panel in this order, Rth of the transparent support layer is preferably from −10 to 100 nm, more preferably from 20 to 70 nm, and still more preferably from 30 to 60 nm.

In the case of the organic EL display device provided with at least a polarizer layer, a transparent support layer made from at least one layer, a λ/2 plate made from a layer containing a discotic liquid crystal compound, a λ/4 plate made from a layer containing a rod-like liquid crystal compound and an organic EL panel in this order, Rth of the transparent support layer is preferably from −50 to 150 nm, more preferably from −30 to 130 nm, and still more preferably from 20 to 70 nm.

In the case of the organic EL display device provided with at least a polarizer layer, a λ/2 plate made from a layer containing a discotic liquid crystal compound, a transparent support layer made from at least one layer, a λ/4 plate made from a layer containing a rod-like liquid crystal compound and an organic EL panel in this order, Rth of the transparent support layer is preferably from −90 to 50 nm, more preferably from −60 to 30 nm, and still more preferably from −20 to 20 nm.

In the case of the organic EL display device provided with at least a polarizer layer, a λ/2 plate made from a layer containing a discotic liquid crystal compound, a λ/4 plate made from a layer containing a rod-like liquid crystal compound, a transparent support layer made from at least one layer and an organic EL panel in this order, Rth of the transparent support layer is preferably from −110 to 40 nm, more preferably from −90 to 20 nm, and still more preferably from −50 to −10 nm.

In the case of the organic EL display device provided with at least a polarizer layer, a first transparent support layer made from at least one layer, a λ/2 plate made from a layer containing a discotic liquid crystal compound, a second transparent support layer made from at least one layer, a λ/4 plate made from a layer containing a rod-like liquid crystal compound and an organic EL panel in this order, Rth of the first transparent support layer is preferably from −40 to 140 nm, more preferably from 0 to 100 nm, and still more preferably from 40 to 80 nm. Also, Rth of the second transparent support layer is preferably from −70 to 70 nm, and more preferably from −30 to 30 nm.

In the case of the organic EL display device provided with at least a polarizer layer, a first transparent support layer made from at least one layer, a λ/2 plate made from a layer containing a discotic liquid crystal compound, a λ/4 plate made from a layer containing a discotic liquid crystal compound, a second transparent support layer made from at least one layer and an organic EL panel in this order, Rth of the first transparent support layer is preferably from −50 to 130 nm, more preferably from −30 to 100 nm, and still more preferably from 0 to 80 nm. Also, Rth of the second transparent support layer is preferably from 0 to 100 nm, and more preferably from 20 to 80 nm.

In the case of the organic EL display device provided with at least a polarizer layer, a first transparent support layer made from at least one layer, a λ/2 plate made from a layer containing a discotic liquid crystal compound, a λ/4 plate made from a layer containing a rod-like liquid crystal compound, a second transparent support layer made from at least one layer and an organic EL panel in this order, Rth of the first transparent support layer is preferably from −40 to 140 nm, more preferably from −20 to 100 nm, and still more preferably from 10 to 50 nm. Also, Rth of the second transparent support layer is preferably from −100 to 40 nm, more preferably from −50 to 0 nm, and still more preferably from −40 to −10 nm.

In the case of the organic EL display device provided with at least a polarizer layer, a λ/2 plate made from a layer containing a discotic liquid crystal compound, a first transparent support layer made from at least one layer, a λ/4 plate made from a layer containing a discotic liquid crystal compound, a second transparent support layer made from at least one layer and an organic EL panel in this order, Rth of the first transparent support layer is preferably from −40 to 150 nm, more preferably from −10 to 100 nm, and still more preferably from 30 to 60 nm. Also, Rth of the second transparent support layer is preferably from −50 to 100 nm more preferably from −30 to 70 nm, and still more preferably from 10 to 50 nm.

In the case of the organic EL display device provided with at least a polarizer layer, a λ/2 plate made from a layer containing a discotic liquid crystal compound, a first transparent support layer made from at least one layer, a λ/4 plate made from a layer containing a rod-like liquid crystal compound, a second transparent support layer made from at least one layer and an organic EL panel in this order, Rth of the first transparent support layer is preferably from −70 to 100 nm, more preferably from −30 to 50 nm, and still more preferably from −10 to 30 nm. Also, Rth of the second transparent support layer is preferably from −110 to 40 nm, more preferably from −80 to 0 nm, and still more preferably from −50 to 0 nm.

In the case of the organic EL display device provided with at least a polarizer layer, a transparent support layer made from at least one layer, a λ/2 plate made from a layer containing a rod-like liquid crystal compound, a λ/4 plate made from a layer containing a discotic liquid crystal compound and an organic EL panel in this order, Rth of the transparent support layer is preferably from −150 to 50 nm, more preferably from −130 to 30 nm, and still more preferably from −90 to 0 nm.

In the case of the organic EL display device provided with at least a polarizer layer, a transparent support layer made from at least one layer, a λ/2 plate made from a layer containing a rod-like liquid crystal compound, a λ/4 plate made from a layer containing a rod-like liquid crystal compound and an organic EL panel in this order, Rth of the transparent support layer is preferably from −30 to 30 nm, and more preferably from −10 to 20 nm.

In the case of the organic EL display device provided with at least a polarizer layer, a λ/2 plate made from a layer containing a rod-like liquid crystal compound, a transparent support layer made from at least one layer, a λ/4 plate made from a layer containing a discotic liquid crystal compound and an organic EL panel in this order, Rth of the transparent support layer is preferably from −50 to 90 nm, more preferably from −30 to 60 nm, and still more preferably from −10 to 10 nm.

In the case of the organic EL display device provided with at least a polarizer layer, a λ/2 plate made from a layer containing a rod-like liquid crystal compound, a transparent support layer made from at least one layer, a λ/4 plate made from a layer containing a rod-like liquid crystal compound and an organic EL panel in this order, Rth of the transparent support layer is preferably from −140 to 10 nm, more preferably from −120 to −10 nm, and still more preferably from −80 to −50 nm.

In the case of the organic EL display device provided with at least a polarizer layer, a λ/2 plate made from a layer containing a rod-like liquid crystal compound, a λ/4 plate made from a layer containing a discotic liquid crystal compound, a transparent support layer made from at least one layer and an organic EL panel in this order, Rth of the transparent support layer is preferably from −50 to 110 nm, more preferably from −30 to 90 nm, and still more preferably from 10 to 50 nm.

In the case of the organic EL display device provided with at least a polarizer layer, a λ/2 plate made from a layer containing a rod-like liquid crystal compound, a λ/4 plate made from a layer containing a rod-like liquid crystal compound, a transparent support layer made from at least one layer and an organic EL panel in this order, Rth of the transparent support layer is preferably from −100 to 10 nm, more preferably from −80 to −20 nm, and still more preferably from −60 to −30 nm.

In the case of the organic EL display device provided with at least a polarizer layer, a first transparent support layer made from at least one layer, a λ/2 plate made from a layer containing a rod-like liquid crystal compound, a second transparent support layer made from at least one layer, a λ/4 plate made from a layer containing a discotic liquid crystal compound and an organic EL panel in this order, Rth of the first transparent support layer is preferably from −140 to 40 nm, more preferably from −100 to 10 nm, and still more preferably from −80 to 0 nm. Also, Rth of the second transparent support layer is preferably from −70 to 70 nm, and more preferably from −40 to 40 nm.

In the case of the organic EL display device provided with at least a polarizer layer, a first transparent support layer made from at least one layer, a λ/2 plate made from a layer containing a rod-like liquid crystal compound, a second transparent support layer made from at least one layer, a λ/4 plate made from a layer containing a rod-like liquid crystal compound and an organic EL panel in this order, Rth of the first transparent support layer is preferably from −150 to 40 nm, more preferably from −120 to 0 nm, and still more preferably from −100 to −50 nm. Also, Rth of the second transparent support layer is preferably from −200 to 0 nm, more preferably from −150 to −50 nm, and still more preferably from −130 to −90 nm.

In the case of the organic EL display device provided with at least a polarizer layer, a first transparent support layer made from at least one layer, a λ/2 plate made from a layer containing a rod-like liquid crystal compound, a λ/4 plate made from a layer containing a discotic liquid crystal compound, a second transparent support layer made from at least one layer and an organic EL panel in this order, Rth of the first transparent support layer is preferably from −140 to 40 nm, more preferably from −100 to 20 nm, and still more preferably from −50 to 0 nm. Also, Rth of the second transparent support layer is preferably from −40 to 100 nm, more preferably from −10 to 50 nm, and still more preferably from 10 to 50 nm.

In the case of the organic EL display device provided with at least a polarizer layer, a first transparent support layer made from at least one layer, a λ/2 plate made from a layer containing a rod-like liquid crystal compound, a λ/4 plate made from a layer containing a rod-like liquid crystal compound, a second transparent support layer made from at least one layer and an organic EL panel in this order, Rth of the first transparent support layer is preferably from −120 to 40 nm, more preferably from −100 to 30 nm, and still more preferably from −70 to 0 nm. Also, Rth of the second transparent support layer is preferably from −100 to 0 nm, and more preferably from −80 to −20 nm.

In the case of the organic EL display device provided with at least a polarizer layer, a λ/2 plate made from a layer containing a rod-like liquid crystal compound, a first transparent support layer made from at least one layer, a λ/4 plate made from a layer containing a discotic liquid crystal compound, a second transparent support layer made from at least one layer and an organic EL panel in this order, Rth of the first transparent support layer is preferably from −100 to 80 nm, more preferably from −60 to 40 nm, and still more preferably from −30 to 20 nm. Also, Rth of the second transparent support layer is preferably from −40 to 100 nm, more preferably from −10 to 70 nm, and still more preferably from 0 to 50 nm.

In the case of the organic EL display device provided with at least a polarizer layer, a λ/2 plate made from a layer containing a rod-like liquid crystal compound, a first transparent support layer made from at least one layer, a λ/4 plate made from a layer containing a rod-like liquid crystal compound, a second transparent support layer made from at least one layer and an organic EL panel in this order, Rth of the first transparent support layer is preferably from −150 to 40 nm, more preferably from −90 to 0 nm, and still more preferably from −60 to −20 nm. Also, Rth of the second transparent support layer is preferably from −100 to 50 nm, more preferably from −70 to 10 nm, and still more preferably from −50 to −10 nm.

Examples of the polymer include a cellulose acylate film (for example, a cellulose triacetate film, a cellulose diacetate film, a cellulose acetate butyrate film or a cellulose acetate propionate film), a polyolefin (for example, polyethylene or polypropylene), a polyester resin film, for example, polyethylene terephthalate or polyethylene naphthalate, a polyether sulfone film, a polyacrylic resin film, for example, polymethyl methacrylate, a polyurethane resin film, a polyester film, a polycarbonate film, a polysulfone film, a polyether film, a polymethylpentene film, a polyether ketone film, a (meth)acrylonitrile film, a polyolefin, and a polymer having an alicyclic structure (a norbornene resin (ARTON, trade name, produced by JSR Corp., an amorphous polyolefin (ZEONEX, trade name, produced by Zeon Corp.)). Of the polymers, triacetyl cellulose, polyethylene terephthalate and a polymer having an alicyclic structure are preferred, and triacetyl cellulose is particularly preferred.

The polymer film is preferably formed by a solvent casting method. As the solvent casting method, a multilayer casting method, for example, a co-casting method, a sequential casting method or a coating method can be used. In the case of producing the film by the co-casting method or the sequential casting method, first a cellulose acetate solution (dope) for each layer is prepared. The co-casting method (multilayer simultaneous casting method) is a casting method wherein individual layers are simultaneously cast by simultaneously extruding co-casting dopes onto a casting support (band or dram) from a casting Giesser through which the individual casting dopes for intended layers (the number of the layers may be three or more) are simultaneously extruded via different slits and the like, and then at an appropriate time, the resulting film is peeled from the casting support and dried, thereby forming a film.

The sequential casting method is a casting method wherein first a casting dope for first layer is extruded through a casting Giesser to cast on a casting support, then after it is dried or not dried, a casting dope for second layer is extruded through the casting Giesser to cast on it, and, if desired, three or more layers are sequentially formed by casting and stacking dopes in the same manner as the above, and then at an appropriate time, the resulting stack is peeled from the casting support and dried, thereby forming a film.

The coating method is commonly a method wherein a film for a core layer is formed by a solution film-forming method, then a coating solution for surface layer is prepared, and then using an appropriate coating machine, the coating solution is first coated on one surface of the film and then coated on the other surface thereof, or simultaneously on both surfaces thereof, and dried, thereby forming a film having a stack structure.

The thickness of the transparent support is ordinarily approximately from 10 to 200 μm, preferably from 10 to 80 μm, and more preferably from 20 to 60 μm. Also, the transparent support may be made from a stack of plural layers. In order to restrain the external light reflection, the thinner thickness is preferred, and the thickness of 10 μm or more is preferred because the strength of film is good. In order to improve adhesion between the transparent support and a layer (an adhesion layer, a vertical oriented film or a retardation layer) to be provided thereon, the transparent support may be subjected to a surface treatment (for example, a glow discharge treatment, a corona discharge treatment, an ultraviolet (UV) ray treatment or a flame treatment). An adhesion layer (an undercoating layer) may be provided on the transparent support. Also, as to the transparent support or long transparent support, in order to impart a sliding property during a transportation process and to prevent adhesion between the surface and the back surface of the rewound support, it is preferred to form a polymer layer containing inorganic particles having an average particle size approximately from 10 to 100 nm in an amount from 5 to 40% in terms of solid content weight ratio by coating on one side of the support or by co-casting with the support.

Although the λ/2 plate or the λ/4 plate, which has a stack structure having the optically anisotropic layer provided on the support is described above, the present invention should not be construed as being limited thereto, and it may have a constitution in which the λ/2 plate and the λ/4 plate are stacked on one side of one transparent support or a constitution in which the λ/2 plate is stacked on one side of the transparent support and the λ/4 plate is stacked on the other side of the transparent support. Further, the λ/2 plate or the λ/4 plate may be made from only a stretched polymer film (optically anisotropic support) or may be made from only a liquid crystal film formed from a composition containing a liquid crystalline compound. Preferred examples of the liquid crystal film are also same as the preferred examples of the optically anisotropic layer described above.

The λ/2 plate and the λ/4 plate are preferably produced continuously in the state of a long film. At this time, the slow axis angle of the λ/2 plate or the λ/4 plate is preferably 15°±8° or 75°±8° to the longitudinal direction of the long film. By setting the slow axis angle to the above, it is possible in the production of optical stack described hereinafter to conform the longitudinal direction of the long film to the longitudinal direction of the polarizing film to perform sticking in a roll-to-roll manner, thereby enabling the production of circular polarizing plate or elliptical polarizing plate with high accuracy in the axis angle of the sticking and high productivity. In the case where the optically anisotropic layer is formed from a liquid crystalline compound, the slow axis angle of the optically anisotropic layer can be adjusted by a rubbing angle. Further, in the case where the λ/2 plate or the λ/4 plate is formed from a polymer film subjected to a stretching treatment (optically anisotropic support), the slow axis angle thereof can be adjusted by the stretching direction.

[Ultraviolet Absorbing Agent]

The organic EL display device according to the invention may contain an ultraviolet absorbing agent in the optically anisotropic layer, transparent support or surface film thereof. By the incorporation of the ultraviolet absorbing agent, the optical stack, organic EL panel, liquid crystal panel or the like can be protected from ultraviolet ray. As the ultraviolet absorbing agent, any known ultraviolet absorbing agent which exhibits an ultraviolet absorbing property may be used. Of the ultraviolet absorbing agents, a benzotriazole ultraviolet absorbing agent or hydroxyphenyltriazine ultraviolet absorbing agent is preferred, in order to obtain a high ultraviolet absorbing property and an ultraviolet absorbing ability (ultraviolet blocking ability) which is used in an electronic image display device. Further, two or more ultraviolet absorbing agents having different maximum absorption wavelengths may be used in combination in order to widen the ultraviolet absorption band.

The content of the ultraviolet absorbing agent may varied depending on the required ultraviolet transmittance or absorbance of the ultraviolet absorbing agent, and it is ordinarily 20 parts by weight or less, preferably from 1 to 20 parts by weight, based on 100 parts by weight of the ultraviolet curable resin. When the content of the ultraviolet absorbing agent is more than 20 parts by weight, there is a tendency that the curability of the curable composition by ultraviolet ray is reduced, and at the same time, there is a concern that the visible light transmittance of the optical film may be reduced. On the other hand, when the content of the ultraviolet absorbing agent is less than 1 part by weight, the ultraviolet absorbing property of the optical film may not be sufficiently exhibited.

[Polarizing Plate]

The polarizing plate for use in the invention has a protective film and a polarizing film. As the polarizing film, any one of an iodine polarizing film, a dye polarizing film using a dichromatic dye and a polyene polarizing film may be used. The iodine polarizing film and the dye polarizing film are ordinarily produced using a polyvinyl alcohol film. The absorption axis of the polarizing film corresponds to the stretching direction of the film. Therefore, the polarizing film stretched in the vertical direction (transporting direction) has an absorption axis parallel to the longitudinal direction, and the polarizing film stretched in the horizontal direction (direction perpendicular to the transporting direction) has the absorption axis perpendicular to the longitudinal direction. As the protective film, a cellulose ester film having a high optical isotropy is preferably used.

A preferred method for producing the polarizing plate for use in the invention includes a process of continuously stacking the optical stack and the polarizing film respectively in a long state. The long polarizing plate is cut to fit the size of a screen used in the image display device.

By using a linear polarizing film as the polarizing film and combining it with the optically anisotropic layer or the transparent support layer described above, a polarizing film-integrated optical film which functions as a circular polarizing plate or an elliptical polarizing plate can be produced with high productivity.

[Organic Electroluminescence Display Device]

The organic electroluminescence display device according to the invention is a display device in which a light emitting layer or a plurality of organic compound thin layers including a light emitting layer is formed between a pair of electrodes made from an anode and a cathode, and may have a hole injection layer, a hole transport layer, an electron injection layer, an electron transport layer, a protective layer and the like in addition to the light emitting layer. Each of these layers may have other function. Various materials can be used for forming each layer.

The anode supplies holes to a hole injection layer, a hole transport layer, a light emitting layer or the like, and a metal, an alloy, a metal oxide, an electrically conductive compound or a mixture thereof can be used therefor, and a material having a work function of 4 eV or more is preferably used. Specific examples of the material include an electrically conductive metal oxide, for example, tin oxide, zinc oxide, indium oxide or indium tin oxide (ITO), a metal, for example, gold, silver, chromium or nickel, a mixture or stack of the metal and the electrically conductive metal oxide, an inorganic electrically conductive material, for example, copper iodide or copper sulfide, an organic electrically conductive material, for example, polyaniline, polythiophene or polypyrrole, and a stack of these materials and ITO. The electrically conductive metal oxide is preferred, and ITO is particularly preferred in view of productivity, high conductivity, transparency and the like. The film thickness of the anode can be appropriately selected according to the material used, and is preferably in a range from 10 nm to 5 μm, more preferably from 50 nm to 1 μm, and still more preferably from 100 to 500 nm.

A substrate is not particularly limited, and is preferably transparent or translucent, and ordinarily, on the substrate, for example, a soda-lime glass, an alkali-free glass or a transparent resin is formed the anode. In the case of using glass, the alkali-free glass is preferably used as the material in order to decrease dissolution of ions from the glass. Also, in the case of using the soda-lime glass, it is preferred to provide a barrier coat, for example, silica thereon.

The thickness of the substrate is not particularly limited as long as it is sufficient for maintaining the mechanical strength thereof. In an embodiment where a light scattering film is used on the surface of display device, when the thickness of the substrate on the viewing side is large, blurring of letter is apt to occur and thus, a smaller thickness of the substrate is more preferred. The thickness of the substrate on the viewing side is preferably from 0.01 to 0.70 mm, more preferably from 0.02 to 0.50 mm, and particularly preferably from 0.03 to 0.30 mm.

In view of the strength and lifetime of the display device, it can be said to be the most preferred configuration to use a thin substrate (preferably glass) of 0.03 to 0.30 mm on the viewing side. When the substrate is thinner than 0.30 μm, it is more preferred to coat a polymer on at least one of one side surface and edge of the substrate to increase the strength.

EXAMPLES

The features of the invention will be described more specifically with reference to the examples and comparative examples below. The materials, amounts of use, proportions, contents of treatments, treating procedures and the like can be appropriately altered as long as the gist of the invention is not exceeded. Therefore, the scope of the invention should not be construed as being limited to the specific examples described below.

(1) Preparation of Transparent Support

Using various known techniques, transparent supports made from cellulose acylate having the optical characteristic shown in Tables 1 to 7 below were prepared.

(2) Coating of Liquid Crystalline Compound on Transparent Support (Alkali Saponification Treatment)

Any of the transparent supports described above was passed through induction heated rollers at temperature of 60° C. to raise the film surface temperature to 40° C., and then on the band surface of the film was coated an alkali solution having the composition shown below in an amount of 14 ml/m² using a bar coater, followed by transporting for 10 seconds under a steam-type far infrared heater (produced by Noritake Co., Ltd.) heated at 110° C. Subsequently, the film was coated with pure water in an amount of 3 ml/m² using a bar coater. Then, water washing by a fountain coater and draining by an air-knife were repeated three times, and the film was dried by transporting in a drying zone at 70° C. for 10 seconds, thereby producing a cellulose acylate film subjected to the alkali saponification treatment.
(Composition of Alkali Solution)
Composition of Alkali Solution (Parts by Weight)

| | |
|---|---|
| Potassium hydroxide | 4.7 parts by weight |
| Water | 15.8 parts by weight |
| Isopropanol | 63.7 parts by weight |
| Surfactant | 1.0 part by weight |
| SF-1: $C_{14}H_{29}O(CH_2CH_2O)_{20}H$ | |
| Propylene glycol | 14.8 parts by weight |

(Formation of Oriented Film)

A coating solution for oriented film having the composition shown below was continuously coated on the long cellulose acetate film subjected to the saponification treatment described above by a wire bar of #14. The coated layer was dried with hot air of 60° C. for 60 seconds and then with hot air of 100° C. for 120 seconds.
Composition of Coating Solution for Oriented Film

| | |
|---|---|
| Modified polyvinyl alcohol shown below | 10 parts by weight |
| Water | 371 parts by weight |
| Methanol | 119 parts by weight |
| Glutaraldehyde | 0.5 parts by weight |
| Photopolymerization initiator (IRGACURE 2959, produced by Ciba Japan K.K.) | 0.3 parts by weight |

Modified polyvinyl alcohol

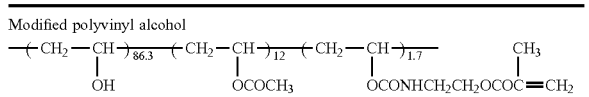

(Formation of Optically Anisotropic Layer Containing Discotic Liquid Crystalline (DLC) Compound)

A rubbing treatment was continuously conducted on the oriented film produced above. At this time, the longitudinal direction of the long film was parallel to the transporting direction thereof, and an angle formed between the longitudinal direction of the film and the rotation axes of the rubbing roll was set at anyone of 15°, 45° and 75°.

Coating solution (A) containing a discotic liquid crystal compound having the composition shown below was continuously coated on the oriented film produced above by a wire bar. The transporting velocity (V) of the film was adjusted to 36 m/min. The film was heated with hot air of 120° C. for 90 seconds for drying the solvent of the coating solution and alignment ripening of the discotic liquid crystal compound. Subsequently, UV irradiation was conducted at 80° C. to fix the orientation of the liquid crystal compound. The thickness of the optically anisotropic layer, that is, the liquid crystal compound layer was adjusted so as to be in a range from 1.6 to 4.0 μm, thereby obtaining various films having Re (550) at 550 nm from 125 to 300 nm.

Composition of Coating Solution (A) for Optically Anisotropic Layer

| | |
|---|---|
| Discotic liquid crystal compound (A) shown below | 91 parts by weight |
| Acrylate monomer shown below | 5 parts by weight |
| Photopolymerization initiator (IRGACURE 907, produced by Ciba Geigy Co., Ltd.) | 3 parts by weight |
| Sensitizer (KAYACURE DETX, produced by Nippon Kayaku Co., Ltd.) | 1 part by weight |
| Pyridinium salt (A) shown below | 0.5 part by weight |
| Fluorine-based polymer (FP1) shown below | 0.2 part by weights |
| Fluorine-based polymer (FP3) shown below | 0.1 part by weights |
| Methyl ethyl ketone | 189 parts by weight |

Discotic liquid crystalline compound (A)

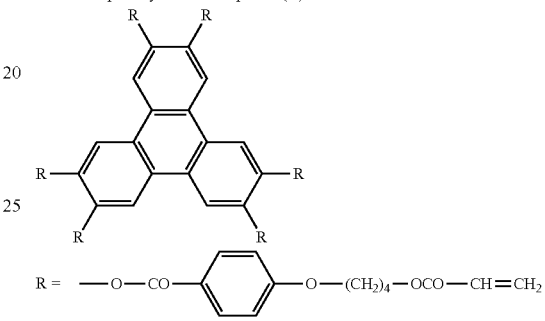

Acrylate monomer
Ethyleneoxide-modified trimethylolpropane triacrylate (V#360, produced by Osaka Organic Chemical Industry Ltd.)
Pyridinium salt (A)

Fluorine-based polymer (FP1)

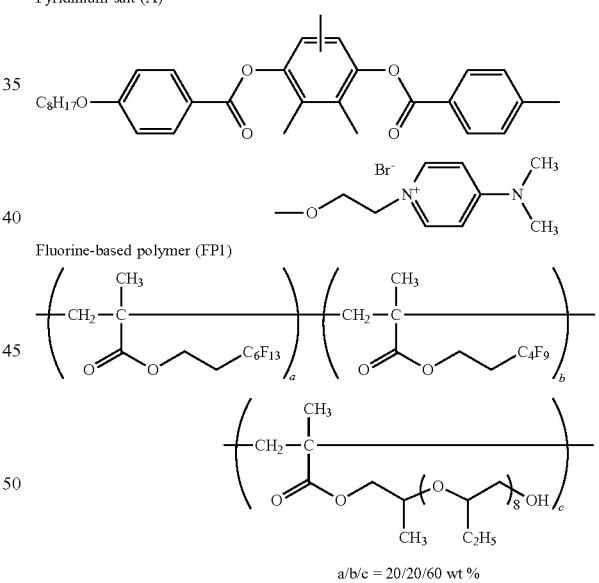

a/b/c = 20/20/60 wt %
Mw = 16000

Fluorine-based polymer (FP3)

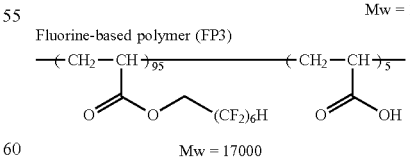

Mw = 17000

The slow axis direction of the film produced was orthogonal to the rotation axes of the rubbing roll. Specifically, the slow axis was in a direction of 15°, 45° or 75° counterclockwise to the longitudinal direction of the support. The average tilt angle of the disc plane of the discotic liquid crystalline molecule to the film plane was 90°, and it was confirmed that the discotic liquid crystal was vertically oriented to the film plane.

(Formation of Optically Anisotropic Layer Containing Rod-Like Liquid Crystal (RLC) Compound)

Coating solution (B) containing a rod-like liquid crystal compound having the composition shown below was coated on the cellulose acylate film in the same manner as in the films described above to obtain various films having Re (550) at 550 nm from 125 to 300 nm. The average tilt angle of the major axis of the rod-like liquid crystal molecule to the film plane was 0°, and it was confirmed that the liquid crystal was oriented parallel to the film plane. The angle of the slow axis is orthogonally crossed with the rotation axes of the rubbing roll.

Composition of Coating Solution (B) for Optically Anisotropic Layer

| | |
|---|---|
| Rod-like liquid crystal compound (A) shown below | 100 parts by weight |
| Photopolymerization initiator (IRGACURE 907, produced by Ciba Japan K.K.) | 3 parts by weight |
| Sensitizer (KAYACURE DETX, produced by Nippon Kayaku Co., Ltd.) | 1 part by weight |
| Fluorine-based polymer (FP1) shown above | 0.3 part by weights |
| Methyl ethyl ketone | 193 parts by weight |
| Cyclohexanone | 50 parts by weight |

Rod-like liquid crystalline compound (A)

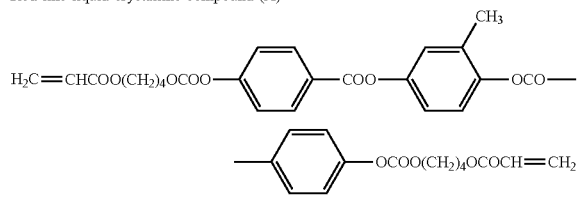

(3) Peeling Off and Transfer of Optically Anisotropic Layer

The optically anisotropic layer formed in the method described above was peeled off from the cellulose acylate film and stuck on an optically anisotropic layer of a cellulose acylate film provided with the optically anisotropic layer prepared separately with an adhesive (transfer). Thus, a cellulose acylate film provided with two kinds of optically anisotropic layers different in the retardation and slow axis was obtained.

(4) Production of Polarizer

A polyvinyl alcohol (PVA) film having a thickness of 80 μm was immersed in an aqueous solution of iodine having an iodine concentration of 0.05% by weight at 30° C. for 60 seconds to dye, vertically stretched 5 times of the original length while immersing in an aqueous solution of boric acid having an boric acid concentration of 4% by weight for 60 seconds, and dried at 50° C. for 4 minutes to obtain a polarizing film having a thickness of 20 μm.

(5) Preparation of Protective Film for Polarizer

A commercially available cellulose acylate film (TD80UL, produced by Fujifilm Corp.) was prepared, immersed in a 1.5 mole/liter aqueous solution of sodium hydroxide at 55° C., and the sodium hydroxide was thoroughly removed by washing with water. Then, the film was immersed in a 0.005 mole/liter aqueous solution of diluted sulfuric acid at 35° C. for one minute and immersed in water to thoroughly wash away the aqueous solution of diluted sulfuric acid. Finally, the film was thoroughly dried at 120° C.

(6) Production of Optical Stack

Examples 1 to 135

On any one of the transparent supports described in (1) above was coated the discotic liquid crystal compound (hereinafter, referred to as DLC) or the rod-like discotic liquid crystal compound (hereinafter, referred to as RLC) in the method described in (2) above. Also, if desired, on both surfaces of one of the transparent support was coated the DLC or the RLC in the method described in (2). Further, if desired, two kinds of different optically anisotropic layer were formed on the transparent support. The film thus-obtained, if desired, one or two or more of the transparent supports described above, and the polarizer described in (4) above were stuck with an adhesive. Finally, the protective film for polarizer described in (5) above was stuck on the surface of the polarizer using a polyvinyl alcohol adhesive. Thus, various optical stacks for Examples 1 to 135 shown in Tables 1 to 7 below were produced, respectively.

Example 138

Preparation of Cellulose Ester Solution A-1

The composition shown below was charged in a mixing tank and stirred with heating to dissolve the respective components, thereby preparing Cellulose ester solution A-1.

Composition of Cellulose Ester Solution A-1

| | |
|---|---|
| Cellulose acetate (acetylation degree: 2.86) | 100 parts by weight |
| Methylene chloride (first solvent) | 320 parts by weight |
| Methanol (second solvent) | 83 parts by weight |
| 1-Butanol (third solvent) | 3 parts by weight |
| Triphenyl phosphate | 7.6 parts by weight |
| Biphenyl diphenyl phosphate | 3.8 parts by weight |

(Preparation of Matting Agent Dispersion B-1)

The composition shown below was charged in a dispersing machine and stirred to dissolve the respective components, thereby preparing Matting agent dispersion B-1.

Composition of Matting Agent Dispersion B-1

| | |
|---|---|
| Silica particle dispersion (average particle size: 16 nm, AEROSIL R972, produced by Nippon Aerosil Co., Ltd.) | 10.0 parts by weight |
| Methylene chloride | 72.8 parts by weight |
| Methanol | 3.9 parts by weight |
| Butanol | 0.5 parts by weight |
| Cellulose ester solution A-1 | 10.3 parts by weight |

(Preparation of Ultraviolet Absorbing Agent Solution C-1)

The composition shown below was charged in another mixing tank, stirred with heating to dissolve the respective components, thereby preparing Ultraviolet absorbing agent solution C-1.

Composition of Ultraviolet Absorbing Agent Solution C-1

| | |
|---|---|
| Ultraviolet absorbing agent (UV-1 shown below) | 10.0 parts by weight |
| Ultraviolet absorbing agent (UV-2 shown below) | 10.0 parts by weight |
| Methylene chloride | 55.7 parts by weight |
| Methanol | 10 parts by weight |
| Butanol | 1.3 parts by weight |
| Cellulose ester solution A-1 | 12.9 parts by weight |

(UV-1)

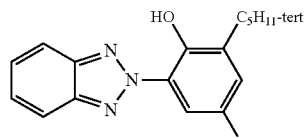

(UV-2)

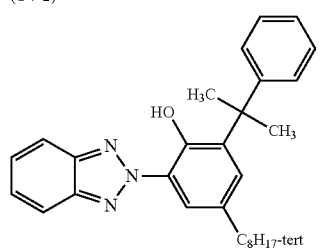

(Production of Cellulose Ester Film)

Ultraviolet absorbing agent solution C-1 was added to a mixture of 94.6 parts by weight of Cellulose acylate solution A-1 and 1.3 parts by weight of Matting Agent Dispersion B-1 in such a manner that the amounts of Ultraviolet absorbing agent (UV-1) and Ultraviolet absorbing agent (UV-2) were 1.0 part by weight based on 100 parts by weight of the cellulose acylate, respectively, and the mixture was thoroughly stirred with heating to dissolve the respective components, thereby preparing a dope. The resulting dope was heated to 30° C. and cast through a casting Giesser on a mirror surface stainless steel support of a drum having a diameter of 3 m. The surface temperature of the support was set −5° C., and the casting width was 1,470 mm. The dope film cast was dried on the drum by supplying dry air of 34° C. at 150 m³/min, and peeled from the drum in the state where the remaining solvent was 150%. During the peeling, 15% of stretching was performed in the transporting direction (longitudinal direction). Then, the film was transported while gripping both ends of the width direction (direction orthogonal to the casting direction) of the film by a pin tenter (the pin tenter described in FIG. 3 of JP-A-4-1009) without performing stretching in the width direction. The film was further dried by transporting through rollers of heat treatment apparatus to produce Cellulose acylate film (T1). The remaining solvent amount, thickness, Re and Rth at 550 nm of Cellulose acylate film (T1) produced in the long form were 0.2%, 60 µm, 0.8 nm and 40 nm, respectively.

(Formation of Oriented Film)

Cellulose acylate film (T1) produced was subjected to the alkali saponification treatment in the same manner as described above. The coating solution for oriented film having the composition shown below was continuously coated on the film by a wire bar of #14. The coated layer was dried with hot air of 60° C. for 60 seconds and then with hot air of 100° C. for 120 seconds.

Composition of Coating Solution for Oriented Film

| | |
|---|---|
| Modified polyvinyl alcohol shown below | 10 parts by weight |
| Water | 75 parts by weight |
| Methanol | 17 parts by weight |
| Isopropanol | 7 parts by weight |
| Photopolymerization initiator (IRGACURE 2959, produced by Ciba Japan K.K.) | 0.8 parts by weight |

Modified polyvinyl alcohol

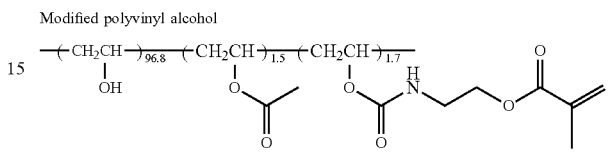

(Formation of Optically Anisotropic Layer Containing Discotic Liquid Crystal (DLC) Compound)

A rubbing treatment was continuously conducted on the oriented film produced above. At this time, the longitudinal direction of the long film was parallel to the transporting direction thereof, and an angle formed between the longitudinal direction of the film and the rotation axes of the rubbing roll was set at 75° (clockwise) (taking the longitudinal direction of the film as 90°, the rotation axes of the rubbing roll being 15°).

Coating solution (C) containing a discotic liquid crystal compound having the composition shown below was continuously coated on the oriented film produced above by a wire bar of #5.0. The transporting velocity (V) of the film was adjusted to 26 m/min. The film was heated with hot air of 115° C. for 90 seconds and then with hot air of 80° C. for 60 seconds for drying the solvent of the coating solution and alignment ripening of the discotic liquid crystal compound. Subsequently, UV irradiation was conducted at 80° C. to fix the orientation of the liquid crystal compound. The average tilt angle of the disc plane of DLC compound to the film plane was 90°, and it was confirmed that DLC compound was vertically oriented to the film plane. Also, the slow axis angle was parallel to the rotation axes of the rubbing roll and when the longitudinal direction of the film is taken as 90°, the rotation axes of the rubbing roll was 15°.

Composition of Coating Solution (C) for Optically Anisotropic Layer

| | |
|---|---|
| Discotic liquid crystal compound (B) shown below | 80 parts by weight |
| Discotic liquid crystal compound (C) shown below | 20 parts by weight |
| Acrylate monomer shown above | 10 parts by weight |
| Photopolymerization initiator (IRGACURE 907, produced by Ciba Japan K.K.) | 3 parts by weight |
| Pyridinium salt (B) shown below | 0.9 parts by weight |
| Boronic acid-containing compound shown below | 0.08 parts by weight |
| Polymer shown below | 0.6 parts by weight |
| Fluorine-based polymer (FP1) shown above | 0.3 part by weights |
| Methyl ethyl ketone | 183 parts by weight |
| Cyclohexanone | 40 parts by weight |

Discotic liquid crystal compound (B)

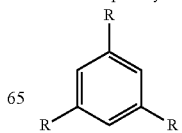

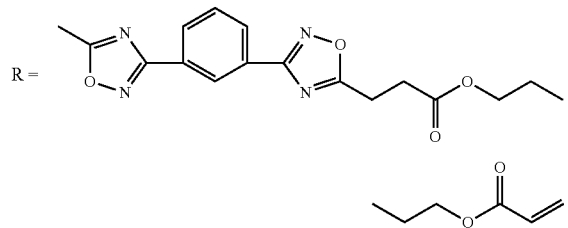

Discotic liquid crystal compound (C)

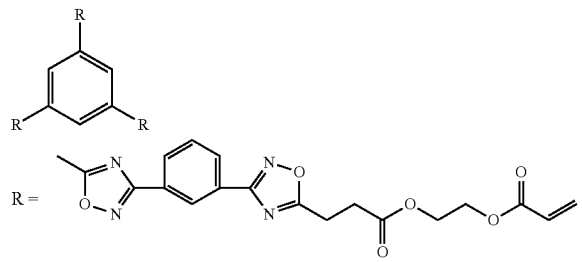

Pyridinium salt (B)

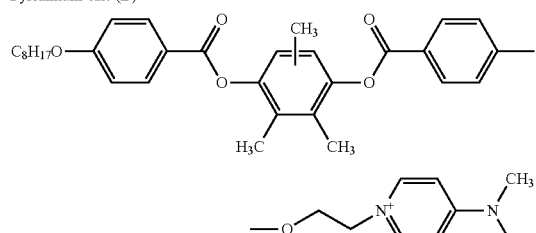

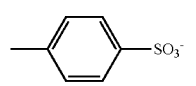

Boronic acid-containing compound

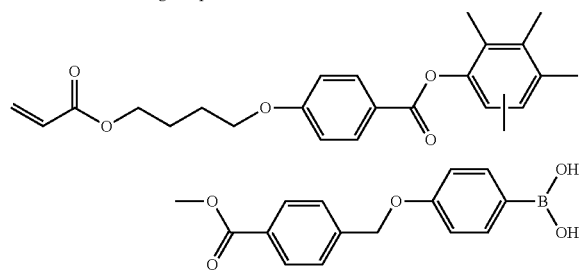

Polymer

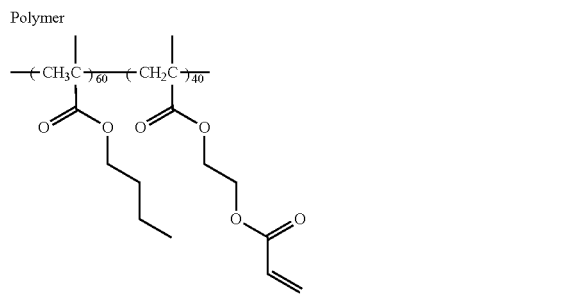

(Formation of Optically Anisotropic Layer Containing Rod-Like Liquid Crystal (RLC) Compound)

A rubbing treatment was continuously conducted on the optically anisotropic layer containing DLC compound produced above. At this time, the longitudinal direction of the long film was parallel to the transporting direction thereof, and an angle formed between the longitudinal direction of the film and the rotation axes of the rubbing roll was set at −75° (counter-clockwise) (taking the longitudinal direction of the film as 90°, the rotation axes of the rubbing roll being 165°).

Coating solution (D) containing a rod-like liquid crystal compound having the composition shown below was continuously coated on the oriented film produced above by a wire bar of #2.2. The transporting velocity (V) of the film was adjusted to 26 m/min. The film was heated with hot air of 60° C. for 60 seconds for drying the solvent of the coating solution and alignment ripening of the discotic liquid crystal compound. Subsequently, UV irradiation was conducted at 60° C. to fix the orientation of the liquid crystal compound. The average tilt angle of the major axis of the rod-like liquid crystal compound to the film plane was 0°, and it was confirmed that the liquid crystal compound was oriented parallel to the film plane. Also, the slow axis angle was orthogonal to the rotation axes of the rubbing roll and when the longitudinal direction of the film is taken as 90°, the rotation axes of the rubbing roll was 75°.

Composition of Coating Solution (D) for Optically Anisotropic Layer

| | |
|---|---|
| Rod-like liquid crystal compound (A) shown above | 20 parts by weight |
| Rod-like liquid crystal compound (B) shown below | 80 parts by weight |
| Photopolymerization initiator (IRGACURE 907, produced by Ciba Japan K.K.) | 3 parts by weight |
| Sensitizer (KAYACURE DETX, produced by Nippon Kayaku Co., Ltd.) | 1 part by weight |
| Fluorine-based polymer (FP4) shown below | 0.3 part by weights |
| Methyl ethyl ketone | 193 parts by weight |
| Cyclohexanone | 50 parts by weight |

Rod-like liquid crystal compound (B)

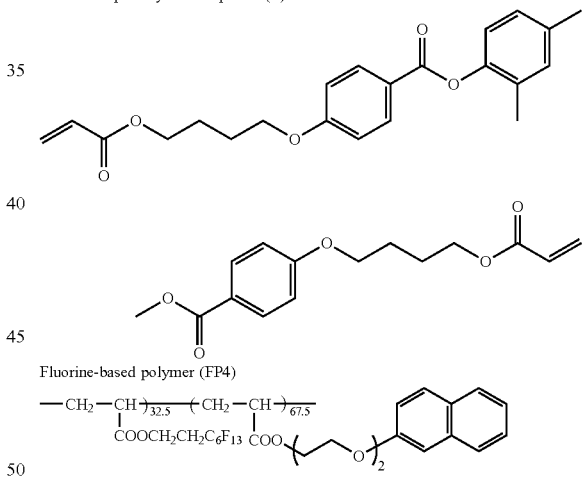

Fluorine-based polymer (FP4)

In the manner described above, Film (F1) in which the optically anisotropic layer containing DLC compound and the optically anisotropic layer containing RLC compound were stacked on a cellulose acylate film was produced. The film was immersed in a 1.5 mole/liter aqueous solution of sodium hydroxide at 55° C., and then the sodium hydroxide was thoroughly removed by washing with water. Thereafter, the film was immersed in a 0.005 mole/liter aqueous solution of diluted sulfuric acid at 35° C. for one minute, and then immersed in water to thoroughly wash away the aqueous solution of diluted sulfuric acid. Finally, the film was thoroughly dried at 120° C.

The polarizer and the protective film for polarizer produced in the same manner as described above were prepared, and Film (F1), the polarizer and the protective film for polarizer were stuck in a manner that the cellulose acylate surface of Film (F1) was brought into contact with the polarizer. Thus, the optical stack for Example 138 was produced.

Example 139

The optically anisotropic layer containing DLC compound and the optically anisotropic layer containing RLC compound were peeled from the cellulose acylate film in Film (F1) described above and were stuck to the polarizer described in (4) above in a manner that the layer made from DLC compound was brought into contact with one surface of the polarizer, and on the other side of the polarizer was stuck the protective film for polarizer described in (5) above using a polyvinyl alcohol adhesive. Thus, the optical stack for Example 139 was produced.

Examples 140 to 143

A commercially available norbornene polymer film (ZE-ONOR ZF14, produced by Optes Inc.) was stretched by setting to have a film thickness of 50 μm, thereby providing a polymer film having Re(550) of 125 nm and Rth(550) of 74 nm. The polymer film was stuck to the optically anisotropic layer, the polarizer and the protective film for polarizer in the same manner as in Examples 1 to 135 described above to produce the optical stacks for Examples 140 to 143 were produced, respectively.

Examples 144 to 147

A λ/4 film of polycarbonate used in a 3D glasses attached to a 3D-TV (55LW5700, produced by LG Electronics Inc.) was peeled off, and the film was stuck to the optically anisotropic layer, the polarizer and the protective film for polarizer in the same manner as in Examples 1 to 135 described above to produce the optical stacks for Examples 144 to 147 shown in Table 8 were produced, respectively.

Comparative Examples 1 to 20

Respective optical stacks for Comparative Examples 1 to 20 shown in Tables 9 to 14 were produced in the same manner as in Examples 1 to 135 described above.

Comparative Example 21

A commercially available norbornene polymer film (ZE-ONOR ZF14, produced by Optes Inc.) was obliquely stretched by setting to have a film thickness of 50 μm, thereby providing a polymer film having Re(550) of 125 nm and Rth(550) of 85 nm. The polymer film was stuck to the transparent support, the polarizer and the protective film for polarizer in the same manner as in Examples 1 to 135 described above to produce the various optical stacks for comparative Example 21 shown in Table 15 were produced.

(7) Installation in Organic EL Element and Evaluation of Display Performance (Installation in Display Device)

GALAXY SII, produced by Samsung equipped with an organic ELL panel was deconstructed and a circular polarizing plate was peeled off, and each of the optical stacks for the examples and comparative examples shown in Tables 1 to 15 below was stuck therefor to produce display devices, respectively.

(Evaluation of Display Performance)

As to the organic EL display device produced, the visibility and display quality under bright light were evaluated.

White display, black display and image display were made on the display device, and reflected light due to the backlight reflections of a fluorescent lamp was observed from the front and at a polar angle of 45 degree. The display quality at the polar angle of 45 degree in comparison with that of the front was evaluated according to the criteria shown below.

4: Tinting is not visually recognized at all (Acceptable).
3: Tint difference is visually recognized, but it is very slight (Acceptable).
2: Although tint difference is visually recognized, reflected light is small, and there is no problem in practical use (Acceptable).
1: Tint difference is visually recognized and reflected light is large, and it is unacceptable.

The evaluation results are shown in Tables 1 and 15 below.

With respect to the angle of the absorption axis and the slow axis angle shown in Tables 1 and 15 below, the angle of the transmission axis of the polarizer is taken as 0° and the clockwise rotation is defused as positive when the organic EL panel was viewed from the viewing side. However, even when the clockwise rotation is defined as negative, the evaluation results shown in Tables 1 and 15 below are not changed at all.

Further, the transmission axis of the polarizer can be stuck at any angle to the organic EL panel.

TABLE 1

| | | Example 1 | Example 2 | Example 3 | Example 4 | Example 5 | Example 6 | Example 7 | Example 8 | Example 9 |
|---|---|---|---|---|---|---|---|---|---|---|
| Schematic Drawing of Optical Stack | | Protective Film Polarizer Transparent Support Layer λ/2 Plate λ/4 Plate | | | | | | | | |
| Polarizer Layer | Angle of Absorption Axis | 90 | 90 | 90 | 90 | 90 | 90 | 90 | 90 | 90 |
| Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 | 0.8 | 0.8 |
| | RtH (550 nm) | −25 | −15 | 20 | −25 | 40 | 140 | −140 | −120 | −40 |
| λ/2 Plate | Material | DLC | DLC | DLC | DLC | DLC | DLC | RLC | RLC | RLC |
| | Re (550 nm) | 250 | 250 | 250 | 250 | 250 | 250 | 250 | 250 | 250 |

TABLE 1-continued

|  |  |  |  |  |  |  |  |  |  |
|---|---|---|---|---|---|---|---|---|---|
|  | RtH (550 nm) | −125 | −125 | −125 | −125 | −125 | −125 | 125 | 125 | 125 |
|  | Slow Axis Angle | 15 | 15 | 15 | 15 | 15 | 15 | 75 | 75 | 75 |
| λ/4 Plate | Material | DLC | DLC | DLC | RLC | RLC | RLC | DLC | DLC | DLC |
|  | Re (550 nm) | 125 | 125 | 125 | 125 | 125 | 125 | 125 | 125 | 125 |
|  | RtH (550 nm) | −62.5 | −62.5 | −62.5 | 62.5 | 62.5 | 62.5 | −62.5 | −62.5 | −62.5 |
|  | Slow Axis Angle | 75 | 75 | 75 | 75 | 75 | 75 | 15 | 15 | 15 |
| Visibility under Bright Light |  | 3 | 3 | 3 | 3 | 3 | 3 | 3 | 3 | 4 |

|  |  | Example 10 | Example 11 | Example 12 | Example 13 | Example 14 | Example 15 | Example 16 | Example 17 | Example 138 |
|---|---|---|---|---|---|---|---|---|---|---|
| Schematic Drawing of Optical Stack |  | Protective Film Polarizer Transparent Support Layer λ/2 Plate λ/4 Plate | | | | | | | | |
| Polarizer Layer | Angle of Absorption Axis | 90 | 90 | 90 | 90 | 90 | 90 | 90 | 90 | 90 |
| Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 | 0.8 | 0.8 | 0.8 |
|  | RtH (550 nm) | 25 | −20 | 10 | 25 | 40 | 160 | −160 | −40 | 40 |
| λ/2 Plate | Material | RLC | RLC | RLC | RLC | DLC | DLC | RLC | RLC | DLC |
|  | Re (550 nm) | 250 | 250 | 250 | 250 | 250 | 250 | 250 | 250 | 250 |
|  | RtH (550 nm) | 125 | 125 | 125 | 125 | −125 | −125 | 125 | 125 | −125 |
|  | Slow Axis Angle | 75 | 75 | 75 | 75 | 15 | 15 | 75 | 75 | 15 |
| λ/4 Plate | Material | DLC | RLC | RLC | RLC | DLC | RLC | DLC | RLC | RLC |
|  | Re (550 nm) | 125 | 125 | 125 | 125 | 125 | 125 | 125 | 125 | 120 |
|  | RtH (550 nm) | −62.5 | 62.5 | 62.5 | 62.5 | −62.5 | 62.5 | −62.5 | 62.5 | 60 |
|  | Slow Axis Angle | 15 | 15 | 15 | 15 | 75 | 75 | 15 | 15 | 75 |
| Visibility under Bright Light |  | 3 | 3 | 3 | 3 | 2 | 2 | 2 | 2 | 4 |

TABLE 2

|  |  | Example 18 | Example 19 | Example 20 | Example 21 | Example 22 | Example 23 | Example 24 | Example 25 | Example 26 |
|---|---|---|---|---|---|---|---|---|---|---|
| Schematic Drawing of Optical Stack |  | Protective Film Polarizer λ/2 Plate Transparent Support Layer λ/4 Plate | | | | | | | | |
| Polarizer Layer | Angle of Absorption Axis | 90 | 90 | 90 | 90 | 90 | 90 | 90 | 90 | 90 |
| λ/4 Plate | Material | DLC | DLC | DLC | DLC | DLC | DLC | RLC | RLC | RLC |
|  | Re (550 nm) | 250 | 250 | 250 | 250 | 250 | 250 | 250 | 250 | 250 |
|  | RtH (550 nm) | −125 | −125 | −125 | −125 | −125 | −125 | 125 | 125 | 125 |
|  | Slow Axis Angle | 15 | 15 | 15 | 15 | 15 | 15 | 75 | 75 | 75 |
| Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 | 0.8 | 0.8 | 0.8 |
|  | RtH (550 nm) | 0 | 60 | 130 | −80 | 10 | 40 | −40 | 0 | 80 |
| λ/4 Plate | Material | DLC | DLC | DLC | RLC | RLC | RLC | DLC | DLC | DLC |
|  | Re (550 nm) | 125 | 125 | 125 | 125 | 125 | 125 | 125 | 125 | 125 |
|  | RtH (550 nm) | −62.5 | −62.5 | −62.5 | 62.5 | 62.5 | 62.5 | −62.5 | −62.5 | −62.5 |
|  | Slow Axis Angle | 75 | 75 | 75 | 75 | 75 | 75 | 15 | 15 | 15 |
| Visibility under Bright Light |  | 3 | 3 | 3 | 3 | 3 | 3 | 3 | 3 | 3 |

|  |  | Example 27 | Example 28 | Example 29 | Example 30 | Example 31 | Example 32 | Example 33 | Example 34 | Example 35 |
|---|---|---|---|---|---|---|---|---|---|---|
| Schematic Drawing of Optical Stack |  | Protective Film Polarizer | | | | | | | | |

TABLE 2-continued

|  |  | λ/2 Plate<br>Transparent Support<br>Layer<br>λ/4 Plate |  |  |  |  |  |  |  |  |
|---|---|---|---|---|---|---|---|---|---|---|
| Polarizer Layer | Angle of Absorption Axis | 90 | 90 | 90 | 90 | 90 | 90 | 90 | 90 | 90 |
| λ/4 Plate | Material | RLC | RLC | RLC | DLC | DLC | DLC | RLC | RLC | RLC |
|  | Re (550 nm) | 250 | 250 | 250 | 250 | 250 | 250 | 250 | 250 | 250 |
|  | RtH (550 nm) | 125 | 125 | 125 | −125 | −125 | −125 | 125 | 125 | 125 |
|  | Slow Axis Angle | 75 | 75 | 75 | 15 | 15 | 15 | 75 | 75 | 75 |
| Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 | 0.8 | 0.8 | 0.8 |
|  | RtH (550 nm) | −130 | −60 | 0 | −20 | 150 | −100 | 100 | −150 | 20 |
| λ/4 Plate | Material | RLC | RLC | RLC | DLC | DLC | RLC | DLC | RLC | RLC |
|  | Re (550 nm) | 125 | 125 | 125 | 125 | 125 | 125 | 125 | 125 | 125 |
|  | RtH (550 nm) | 62.5 | 62.5 | 62.5 | −62.5 | −62.5 | 62.5 | −62.5 | 62.5 | 62.5 |
|  | Slow Axis Angle | 15 | 15 | 15 | 75 | 75 | 75 | 15 | 15 | 15 |
| Visibility under Bright Light |  | 3 | 3 | 3 | 2 | 2 | 2 | 2 | 2 | 2 |

TABLE 3

|  |  | Example 36 | Example 37 | Example 38 | Example 39 | Example 40 | Example 41 | Example 42 | Example 43 | Example 44 | Example 45 |
|---|---|---|---|---|---|---|---|---|---|---|---|
| Schematic Drawing of Optical Stack |  | Protective Film<br>Polarizer<br>λ/2 Plate<br>λ/4 Plate<br>Transparent<br>Support Layer |  |  |  |  |  |  |  |  |  |
| Polarizer Layer | Angle of Absorption Axis | 90 | 90 | 90 | 90 | 90 | 90 | 90 | 90 | 90 | 90 |
| λ/2 Plate | Material | DLC | DLC | DLC | DLC | DLC | DLC | RLC | RLC | RLC | RLC |
|  | Re (550 nm) | 250 | 250 | 250 | 250 | 250 | 250 | 250 | 250 | 250 | 250 |
|  | Rth (550 nm) | −125 | −125 | −125 | −125 | −125 | −125 | 125 | 125 | 125 | 125 |
|  | Slow Axis Angle | 15 | 15 | 15 | 15 | 15 | 15 | 75 | 75 | 75 | 75 |
| λ/4 Plate | Material | DLC | DLC | DLC | RLC | RLC | RLC | DLC | DLC | DLC | RLC |
|  | Re (550 nm) | 125 | 125 | 125 | 125 | 125 | 125 | 125 | 125 | 125 | 125 |
|  | Rth (550 nm) | −62.5 | −62.5 | −62.5 | 62.5 | 62.5 | 62.5 | −62.5 | −62.5 | −62.5 | 62.5 |
|  | Slow Axis Angle | 75 | 75 | 75 | 75 | 75 | 75 | 15 | 15 | 15 | 15 |
| Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 | 0.8 | 0.8 | 0.8 | 0.8 |
|  | Rth (550 nm) | 0 | 40 | 90 | −100 | −30 | 30 | −40 | 30 | 100 | −90 |
| Visibility under Bright Light |  | 3 | 3 | 3 | 3 | 3 | 3 | 3 | 3 | 3 | 3 |

|  |  | Example 46 | Example 47 | Example 48 | Example 49 | Example 50 | Example 51 | Example 52 | Example 53 | Example 54 | Example 55 |
|---|---|---|---|---|---|---|---|---|---|---|---|
| Schematic Drawing of Optical Stack |  | Protective Film<br>Polarizer<br>λ/2 Plate<br>λ/4 Plate<br>Transparent<br>Support Layer |  |  |  |  |  |  |  |  |  |
| Polarizer Layer | Angle of Absorption Axis | 90 | 90 | 90 | 90 | 90 | 90 | 90 | 90 | 90 | 90 |
| λ/2 Plate | Material | RLC | RLC | DLC | DLC | DLC | DLC | RLC | RLC | RLC | RLC |
|  | Re (550 nm) | 250 | 250 | 250 | 250 | 250 | 250 | 250 | 250 | 250 | 250 |
|  | Rth (550 nm) | 125 | 125 | −125 | −125 | −125 | −125 | 125 | 125 | 125 | 125 |
|  | Slow Axis Angle | 75 | 75 | 15 | 15 | 15 | 15 | 75 | 75 | 75 | 75 |

TABLE 3-continued

| λ/4 Plate | Material | RLC | RLC | DLC | DLC | RLC | RLC | DLC | DLC | RLC | RLC |
|---|---|---|---|---|---|---|---|---|---|---|---|
| | Re (550 nm) | 125 | 125 | 125 | 125 | 125 | 125 | 125 | 125 | 125 | 125 |
| | Rth (550 nm) | 62.5 | 62.5 | −62.5 | −62.5 | 62.5 | 62.5 | −62.5 | −62.5 | 62.5 | 62.5 |
| | Slow Axis Angle | 15 | 15 | 75 | 75 | 75 | 75 | 15 | 15 | 15 | 15 |
| Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 | 0.8 | 0.8 | 0.8 |
| | Rth (550 nm) | −40 | 0 | −20 | 110 | −120 | 50 | −60 | 120 | −110 | 20 |
| Visibility under Bright Light | | 3 | 3 | 2 | 2 | 2 | 2 | 2 | 2 | 2 | 2 |

TABLE 4

| | | Example 56 | Example 57 | Example 58 | Example 59 | Example 60 | Example 61 | Example 62 |
|---|---|---|---|---|---|---|---|---|
| Schematic Drawing of Optical Stack | | Protective Film Polarizer First Transparent Support Layer λ/2 Plate Second Transparent Support Layer λ/4 Plate | | | | | | |
| Polarizer Layer | Angle of Absorption Axis | 90 | 90 | 90 | 90 | 90 | 90 | 90 |
| First Transparent Support Layer | Material | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 |
| | Rth (550 nm) | −10 | 0 | 90 | 140 | 130 | 70 | −25 |
| λ/2 Plate | Material | DLC | DLC | DLC | DLC | DLC | DLC | DLC |
| | Re (550 nm) | 250 | 250 | 250 | 250 | 250 | 250 | 250 |
| | Rth (550 nm) | −125 | −125 | −125 | −125 | −125 | −125 | −125 |
| | Slow Axis Angle | 15 | 15 | 15 | 15 | 15 | 15 | 15 |
| Second Transparent Support Layer | Material | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 |
| | Rth (550 nm) | 100 | 0 | 40 | 100 | 180 | 100 | −50 |
| λ/4 Plate | Material | DLC | DLC | DLC | DLC | DLC | DLC | RLC |
| | Re (550 nm) | 125 | 125 | 125 | 125 | 125 | 125 | 125 |
| | Rth (550 nm) | −62.5 | −62.5 | −62.5 | −62.5 | −62.5 | −62.5 | 62.5 |
| | Slow Axis Angle | 75 | 75 | 75 | 75 | 75 | 75 | 75 |
| Visibility under Bright Light | | 3 | 3 | 3 | 3 | 3 | 4 | 3 |

| | | Example 63 | Example 64 | Example 65 | Example 66 | Example 67 | Example 68 | Example 69 |
|---|---|---|---|---|---|---|---|---|
| Schematic Drawing of Optical Stack | | | | | | | | |
| Polarizer Layer | Angle of Absorption Axis | 90 | 90 | 90 | 90 | 90 | 90 | 90 |
| First Transparent Support Layer | Material | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 |
| | Rth (550 nm) | −25 | 120 | 120 | 45 | −100 | −100 | 30 |
| λ/2 Plate | Material | DLC | DLC | DLC | DLC | RLC | RLC | RLC |
| | Re (550 nm) | 250 | 250 | 250 | 250 | 250 | 250 | 250 |
| | Rth (550 nm) | −125 | −125 | −125 | −125 | 125 | 125 | 125 |
| | Slow Axis Angle | 15 | 15 | 15 | 15 | 75 | 75 | 75 |
| Second Transparent Support Layer | Material | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 |
| | Rth (550 nm) | 50 | −50 | 50 | 0 | 50 | −55 | 80 |
| λ/4 Plate | Material | RLC | RLC | RLC | RLC | DLC | DLC | DLC |
| | Re (550 nm) | 125 | 125 | 125 | 125 | 125 | 125 | 125 |
| | Rth (550 nm) | 62.5 | 62.5 | 62.5 | 62.5 | −62.5 | −62.5 | −62.5 |

TABLE 4-continued

|  |  |  |  |  |  |  |  |
|---|---|---|---|---|---|---|---|
|  | Slow Axis Angle | 75 | 75 | 75 | 75 | 15 | 15 | 15 |
| Visibility under Bright Light |  | 3 | 3 | 3 | 3 | 3 | 3 | 3 |

|  |  | Example 70 | Example 71 | Example 72 | Example 73 | Example 74 | Example 75 | Example 76 |
|---|---|---|---|---|---|---|---|---|
| Schematic Drawing of Optical Stack |  | \multicolumn{7}{c}{Protective Film / Polarizer / First Transparent Support Layer / λ/2 Plate / Second Transparent Support Layer / λ/4 Plate} |
| Polarizer Layer | Angle of Absorption Axis | 90 | 90 | 90 | 90 | 90 | 90 | 90 |
| First Transparent Support Layer | Material | Cellulose Acylate | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 | 0.8 |
|  | Rth (550 nm) | −40 | −130 | −110 | 25 | 20 | −80 | 160 |
| λ/2 Plate | Material | RLC | RLC | RLC | RLC | RLC | RLC | DLC |
|  | Re (550 nm) | 250 | 250 | 250 | 250 | 250 | 250 | 250 |
|  | Rth (550 nm) | 125 | 125 | 125 | 125 | 125 | 125 | −125 |
|  | Slow Axis Angle | 75 | 75 | 75 | 75 | 75 | 75 | 15 |
| Second Transparent Support Layer | Material | Cellulose Acylate | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 | 0.8 |
|  | Rth (550 nm) | 0 | −100 | −180 | −100 | −10 | −120 | 150 |
| λ/4 Plate | Material | DLC | RLC | RLC | RLC | RLC | RLC | DLC |
|  | Re (550 nm) | 125 | 125 | 125 | 125 | 125 | 125 | 125 |
|  | Rth (550 nm) | −62.5 | −62.5 | 62.5 | 62.5 | 62.5 | 62.5 | −62.5 |
|  | Slow Axis Angle | 15 | 15 | 15 | 15 | 15 | 15 | 75 |
| Visibility under Bright Light |  | 3 | 3 | 3 | 3 | 3 | 4 | 2 |

|  |  | Example 77 | Example 78 | Example 79 | Example 80 | Example 81 | Example 82 |
|---|---|---|---|---|---|---|---|
| Schematic Drawing of Optical Stack |  |  |  |  |  |  |  |
| Polarizer Layer | Angle of Absorption Axis | 90 | 90 | 90 | 90 | 90 | 90 |
| First Transparent Support Layer | Material | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 |
|  | Rth (550 nm) | 60 | 160 | −100 | −150 | −150 | 20 |
| λ/2 Plate | Material | DLC | DLC | RLC | RLC | RLC | RLC |
|  | Re (550 nm) | 250 | 250 | 250 | 250 | 250 | 250 |
|  | Rth (550 nm) | −125 | −125 | 125 | 125 | 125 | 125 |
|  | Slow Axis Angle | 15 | 15 | 75 | 75 | 75 | 75 |
| Second Transparent Support Layer | Material | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 |
|  | Rth (550 nm) | −10 | −100 | 80 | −100 | −180 | 30 |
| λ/4 Plate | Material | DLC | RLC | DLC | RLC | RLC | RLC |
|  | Re (550 nm) | 125 | 125 | 125 | 125 | 125 | 125 |
|  | Rth (550 nm) | −62.5 | 62.5 | −62.5 | 62.5 | 62.5 | 62.5 |
|  | Slow Axis Angle | 75 | 75 | 15 | 15 | 15 | 15 |
| Visibility under Bright Light |  | 2 | 2 | 2 | 2 | 2 | 2 |

TABLE 5

| | | Example 83 | Example 84 | Example 85 | Example 86 | Example 87 | Example 88 | Example 89 | Example 90 | Example 91 | Example 92 | Example 93 | Example 94 | Example 95 |
|---|---|---|---|---|---|---|---|---|---|---|---|---|---|---|
| Schematic Drawing of Optical Stack | | Protective Film / Polarizer / First Transparent Support Layer / λ/2 Plate / λ/4 Plate / Second Transparent Support Layer | | | | | | | | | | | | |
| Polarizer Layer | Angle of Absorption Axis | 90 | 90 | 90 | 90 | 90 | 90 | 90 | 90 | 90 | 90 | 90 | 90 | 90 |
| First Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 | 0.8 | 0.8 | 0.8 | 0.8 | 0.8 | 0.8 |
| | Rth (550 nm) | −10 | −10 | 120 | 40 | 0 | 0 | 130 | 40 | −10 | 10 | 10 | −40 | −100 |
| λ/2 Plate | Material | DLC | DLC | DLC | DLC | DLC | DLC | DLC | DLC | RLC | RLC | RLC | RLC | RLC |
| | Re (550 nm) | 250 | 250 | 250 | 250 | 250 | 250 | 250 | 250 | 250 | 250 | 250 | 250 | 250 |
| | Rth (550 nm) | −125 | −125 | −125 | −125 | −125 | −125 | −125 | −125 | 125 | 125 | 125 | 125 | 125 |
| | Slow Axis Angle | 15 | 15 | 15 | 15 | 15 | 15 | 15 | 15 | 75 | 75 | 75 | 75 | 75 |
| λ/4 Plate | Material | DLC | DLC | DLC | DLC | RLC | RLC | RLC | RLC | DLC | DLC | DLC | DLC | RLC |
| | Re (550 nm) | 125 | 125 | 125 | 125 | 125 | 125 | 125 | 125 | 125 | 125 | 125 | 125 | 125 |
| | Rth (550 nm) | −62.5 | −62.5 | −62.5 | −62.5 | 62.5 | 62.5 | 62.5 | 62.5 | −62.5 | −62.5 | −62.5 | −62.5 | 62.5 |
| | Slow Axis Angle | 75 | 75 | 75 | 75 | 75 | 75 | 75 | 75 | 15 | 15 | 15 | 15 | 15 |
| Second Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 | 0.8 | 0.8 | 0.8 | 0.8 | 0.8 | 0.8 |
| | Rth (550 nm) | 80 | 10 | 60 | 40 | 40 | −90 | 0 | −30 | −120 | −30 | 80 | 40 | −80 |
| Visibility under Bright Light | | 3 | 3 | 3 | 3 | 3 | 3 | 3 | 3 | 3 | 3 | 3 | 3 | 3 |

| | | Example 96 | Example 97 | Example 98 | Example 99 | Example 100 | Example 101 | Example 102 | Example 103 | Example 104 | Example 105 | Example 106 | Example 107 | Example 108 |
|---|---|---|---|---|---|---|---|---|---|---|---|---|---|---|
| Schematic Drawing of Optical Stack | | Protective Film / Polarizer / First Transparent Support Layer / λ/2 Plate / λ/4 Plate / Second Transparent Support Layer | | | | | | | | | | | | |
| Polarizer Layer | Angle of Absorption Axis | 90 | 90 | 90 | 90 | 90 | 90 | 90 | 90 | 90 | 90 | 90 | 90 | 90 |
| First Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 | 0.8 | 0.8 | 0.8 | 0.8 | 0.8 | 0.8 |
| | RtH (550 nm) | 25 | 25 | −40 | −10 | 160 | 0 | 0 | 150 | −10 | 10 | 10 | −140 | 10 |
| λ/2 Plate | Material | RLC | RLC | RLC | DLC | DLC | DLC | DLC | DLC | RLC | RLC | RLC | RLC | RLC |

TABLE 5-continued

| | | 1 | 2 | 3 | 4 | 5 | 6 | 7 | 8 | 9 | 10 | 11 | 12 | 13 | 14 |
|---|---|---|---|---|---|---|---|---|---|---|---|---|---|---|---|
| λ/4 Plate | Re (550 nm) | 250 | 250 | 250 | 250 | 250 | 250 | 250 | 250 | 250 | 250 | 250 | 250 | 250 | 250 |
| | Rth (550 nm) | 125 | 125 | 125 | −125 | −125 | −125 | −125 | −125 | −125 | 125 | −125 | −125 | 125 | 125 |
| | Slow Axis Angle | 75 | 75 | 75 | 15 | 15 | 15 | 15 | 15 | 15 | 75 | 15 | 15 | 75 | 75 |
| | Material | RLC | RLC | RLC | DLC | DLC | DLC | DLC | DLC | DLC | RLC | DLC | DLC | RLC | RLC |
| Second Transparent Support | Re (550 nm) | 125 | 125 | 125 | 125 | 125 | 125 | 125 | 125 | 125 | 125 | 125 | 125 | 125 | 125 |
| | Rth (550 nm) | 62.5 | 62.5 | 62.5 | −62.5 | −62.5 | −62.5 | −62.5 | −62.5 | −62.5 | 62.5 | −62.5 | −62.5 | 62.5 | 62.5 |
| | Slow Axis Angle | 15 | 15 | 15 | 15 | 15 | 15 | 15 | 15 | 15 | 15 | 15 | 15 | 15 | 15 |
| | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
| Layer | Re (550 nm) | 0.8 | 0.8 | 0.8 | 0.8 | 0.8 | 0.8 | 0.8 | 0.8 | 0.8 | 0.8 | 0.8 | 0.8 | 0.8 | 0.8 |
| | Rth (550 nm) | −10 | −50 | −60 | −10 | 60 | −120 | 60 | −150 | 0 | −150 | −50 | 110 | −80 | 10 |
| Visibility under Bright Light | | 3 | 3 | 3 | 2 | 2 | 2 | 2 | 2 | 2 | 2 | 2 | 2 | 2 | 2 |

TABLE

| | | Example 109 | Example 110 | Example 111 | Example 112 | Example 113 | Example 114 | Example 115 | Example 116 | Example 117 | Example 118 | Example 119 | Example 120 | Example 121 |
|---|---|---|---|---|---|---|---|---|---|---|---|---|---|---|
| Schematic Drawing of Optical Stack | | Protective Film / Polarizer / λ/2 Plate / First Transparent Support Layer / λ/4 Plate / Second Transparent Support Layer | | | | | | | | | | | | |
| Polarizer Layer | Angle of Absorption Axis | 90 | 90 | 90 | 90 | 90 | 90 | 90 | 90 | 90 | 90 | 90 | 90 | 90 |
| λ/2 Plate | Material | DLC | DLC | DLC | DLC | DLC | DLC | DLC | DLC | RLC | RLC | RLC | RLC | RLC |
| | Re (550 nm) | 250 | 250 | 250 | 250 | 250 | 250 | 250 | 250 | 250 | 250 | 250 | 250 | 250 |
| | Rth (550 nm) | −125 | −125 | −125 | −125 | −125 | −125 | −125 | −125 | 125 | 125 | 125 | 125 | 125 |
| | Slow Axis Angle | 15 | 15 | 15 | 15 | 15 | 15 | 15 | 15 | 75 | 75 | 75 | 75 | 75 |
| First Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 | 0.8 | 0.8 | 0.8 | 0.8 | 0.8 | 0.8 |
| | Rth (550 nm) | −20 | 50 | 130 | 45 | −60 | 20 | 55 | 0 | −55 | 0 | 50 | 0 | −120 |
| λ/4 Plate | Material | DLC | DLC | DLC | DLC | RLC | RLC | RLC | RLC | DLC | DLC | DLC | DLC | RLC |
| | Re (550 nm) | 125 | 125 | 125 | 125 | 125 | 125 | 125 | 125 | 125 | 125 | 125 | 125 | 125 |
| | Rth (550 nm) | −62.5 | −62.5 | −62.5 | −62.5 | 62.5 | 62.5 | 62.5 | 62.5 | −62.5 | −62.5 | −62.5 | −62.5 | 62.5 |
| | Slow Axis Angle | 75 | 75 | 75 | 75 | 75 | 75 | 75 | 75 | 15 | 15 | 15 | 15 | 15 |
| Second Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 | 0.8 | 0.8 | 0.8 | 0.8 | 0.8 | 0.8 |
| | Rth (550 nm) | 50 | 80 | −40 | 40 | 0 | 30 | −80 | −40 | 60 | −30 | −10 | 20 | 30 |
| Visibility under Bright Light | | 3 | 3 | 3 | 3 | 3 | 3 | 3 | 3 | 3 | 3 | 3 | 3 | 3 |

| | | Example 122 | Example 123 | Example 124 | Example 125 | Example 126 | Example 127 | Example 128 | Example 129 | Example 130 | Example 131 | Example 132 | Example 133 |
|---|---|---|---|---|---|---|---|---|---|---|---|---|---|
| Schematic Drawing of Optical Stack | | Protective Film / Polarizer / λ/2 Plate / First Transparent Support Layer / λ/4 Plate / Second Transparent Support Layer | | | | | | | | | | | |
| Polarizer Layer | Angle of Absorption Axis | 90 | 90 | 90 | 90 | 90 | 90 | 90 | 90 | 90 | 90 | 90 | 90 |
| λ/2 Plate | Material | RLC | RLC | RLC | RLC | RLC | RLC | RLC | RLC | RLC | RLC | RLC | RLC |
| | Re (550 nm) | 250 | 250 | 250 | 250 | 250 | 250 | 250 | 250 | 250 | 250 | 250 | 250 |
| | Rth (550 nm) | 125 | 125 | 125 | 125 | 125 | 125 | 125 | 125 | 125 | 125 | 125 | 125 |
| | Slow Axis Angle | 75 | 75 | 75 | 75 | 75 | 75 | 75 | 75 | 75 | 75 | 75 | 75 |

TABLE-continued

| First Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
|---|---|---|---|---|---|---|---|---|---|---|---|---|---|
| | Re (550 nm) | 0.8 | 0.8 | 0.8 | 0.8 | 0.8 | 0.8 | 0.8 | 0.8 | 0.8 | 0.8 | 0.8 | 0.8 |
| | Rth (550 nm) | −50 | 30 | −40 | 50 | 130 | −80 | 20 | 0 | 80 | −120 | −50 | 50 |
| λ/4 Plate | Material | RLC | RLC | RLC | DLC | DLC | RLC | RLC | DLC | DLC | RLC | RLC | RLC |
| | Re (550 nm) | 125 | 125 | 125 | 125 | 125 | 125 | 125 | 125 | 125 | 125 | 125 | 125 |
| | Rth (550 nm) | 62.5 | 62.5 | 62.5 | −62.5 | −62.5 | 62.5 | 62.5 | −62.5 | −62.5 | 62.5 | 62.5 | 62.5 |
| | Slow Axis Angle | 15 | 15 | 15 | 75 | 75 | 75 | 75 | 15 | 15 | 15 | 15 | 15 |
| Second Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate | Cellulose Acylate |
| | Re (550 nm) | 0.8 | 0.8 | 0.8 | 0.8 | 0.8 | 0.8 | 0.8 | 0.8 | 0.8 | 0.8 | 0.8 | 0.8 |
| | Rth (550 nm) | −80 | −60 | −40 | 110 | −60 | 0 | 50 | −50 | −10 | 50 | −110 | −60 |
| Visibility under Bright Light | | 3 | 3 | 3 | 2 | 2 | 2 | 2 | 2 | 2 | 2 | 2 | 2 |

TABLE 7

|  | Example 134 | Example 135 |
|---|---|---|
| Schematic Drawing of Optical Stack | Protective Film<br>Polarizer<br>First Transparent Support Layer<br>λ/2 Plate<br>Second Transparent Support Layer<br>λ/4 Plate | |
| Polarizer Layer — Angle of Absorption Axis | 90 | 90 |
| First Transparent — Material | Cellulose Acylate | Cellulose Acylate |
| — Re (550 nm) | 0.8 | 0.8 |

TABLE 7-continued

|  |  | Example 134 | Example 135 |
|---|---|---|---|
| Support Layer | Rth (550 nm) | 70 | −80 |
| λ/2 Plate | Material | DLC | RLC |
|  | Re (550 nm) | 275 | 275 |
|  | Rth (550 nm) | −138 | 138 |
|  | Slow Axis Angle | 15 | 75 |
| Second Transparent Support Layer | Material | Cellulose Acylate | Cellulose Acylate |
|  | Re (550 nm) | 0.8 | 0.8 |
|  | Rth (550 nm) | 100 | −120 |
| λ/4 Plate | Material | DLC | RLC |
|  | Re (550 nm) | 138 | 138 |
|  | Rth (550 nm) | −69 | 69 |
|  | Slow Axis Angle | 75 | 15 |
| Visibility under Bright Light |  | 4 | 4 |

TABLE 8

|  |  | Example 139 | Example 140 | Example 141 | Example 142 | Example 143 | Example 144 | Example 145 | Example 146 | Example 147 |
|---|---|---|---|---|---|---|---|---|---|---|
| Schematic Drawing of Optical Stack |  | Protective Film<br>Polarizer<br>λ/2 Plate<br>λ/4 Plate | | | | | | | | |
| Polarizer Layer | Angle of Absorption Axis | 90 | 90 | 90 | 90 | 90 | 90 | 90 | 90 | 90 |
| λ/2 Plate | Material | DLC | Norbornene | RLC | Norbornene | DLC | Polycarbonate | RLC | Polycarbonate | DLC |
|  | Re (550 nm) | 250 | 250 | 250 | 250 | 250 | 250 | 250 | 250 | 250 |
|  | Rth (550 nm) | −125 | 148 | 125 | 148 | −125 | 104 | 125 | 104 | −125 |
|  | Slow Axis Angle | 15 | 75 | 75 | 75 | 15 | 75 | 75 | 75 | 15 |
| λ/4 Plate | Material | RLC | RLC | Norbornene | DLC | Norbornene | RLC | Polycarbonate | DLC | Polycarbonate |
|  | Re (550 nm) | 120 | 125 | 125 | 125 | 125 | 125 | 125 | 125 | 125 |
|  | Rth (550 nm) | 60 | 62.5 | 74 | −62.5 | 74 | 62.5 | 52 | −62.5 | 52 |
|  | Slow Axis Angle | 75 | 15 | 15 | 15 | 75 | 15 | 15 | 15 | 75 |
| Visibility under Bright Light |  | 4 | 3 | 3 | 4 | 4 | 3 | 3 | 4 | 4 |

TABLE 9

|  |  | Comparative Example 1 | Comparative Example 2 | Comparative Example 3 | Comparative Example 4 |
|---|---|---|---|---|---|
| Schematic Drawing of Optical Stack |  | Protective Film<br>Polarizer<br>Transparent Support Layer<br>λ/2 Plate<br>λ/4 Plate | | | |
| Polarizer Layer | Angle of Absorption Axis | 90 | 90 | 90 | 90 |
| Transparent Support Layer | Material | Cellulose Acylate | Cellulose Acylate | Cellulose Acylate | Cellulose Acylate |
|  | Re (550 nm) | 0.8 | 0.8 | 0.8 | 0.8 |
|  | Rth (550 nm) | −40 | −60 | 60 | 50 |
| λ/2 Plate | Material | DLC | DLC | RLC | RLC |
|  | Re (550 nm) | 250 | 250 | 250 | 250 |
|  | Rth (550 nm) | −125 | −125 | 125 | 125 |
|  | Slow Axis Angle | 15 | 15 | 75 | 75 |
| λ/4 Plate | Material | DLC | RLC | DLC | RLC |
|  | Re (550 nm) | 125 | 125 | 125 | 125 |
|  | Rth (550 nm) | −62.5 | 62.5 | −62.5 | 62.5 |
|  | Slow Axis Angle | 75 | 75 | 15 | 15 |
| Visibility under Bright Light |  | 1 | 1 | 1 | 1 |

TABLE 10

|  |  | Comparative Example 5 | Comparative Example 6 |
|---|---|---|---|
| Schematic Drawing of Optical Stack |  | Protective Film<br>Polarizer<br>λ/2 Plate<br>Transparent Support Layer<br>λ/4 Plate | |
| Polarizer Layer | Angle of Absorption Axis | 90 | 90 |
| λ/2 Plate | Material | DLC | RLC |
|  | Re (550 nm) | 250 | 250 |
|  | Rth (550 nm) | −125 | 125 |
|  | Slow Axis Angle | 15 | 75 |
| Transparent Support Layer | Material | Cellulose Acylate | Cellulose Acylate |
|  | Re (550 nm) | 0.8 | 0.8 |
|  | Rth (550 nm) | 60 | −60 |
| λ/4 Plate | Material | RLC | DLC |
|  | Re (550 nm) | 125 | 125 |
|  | Rth (550 nm) | 62.5 | −62.5 |
|  | Slow Axis Angle | 75 | 15 |
| Visibility under Bright Light |  | 1 | 1 |

TABLE 11

|  |  | Comparative Example 7 | Comparative Example 8 | Comparative Example 9 | Comparative Example 10 | Comparative Example 11 | Comparative Example 12 | Comparative Example 13 | Comparative Example 14 |
|---|---|---|---|---|---|---|---|---|---|
| Schematic Drawing of Optical Stack |  | Protective Film<br>Polarizer<br>First Transparent Support Layer<br>λ/2 Plate<br>Second Transparent Support Layer<br>λ/4 Plate | | | | | | | |
| Polarizer Layer | Angle of Absorption Axis | 90 | 90 | 90 | 90 | 90 | 90 | 90 | 90 |
| First Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 | 0.8 | 0.8 |
|  | Rth (550 nm) | −50 | 60 | −80 | −80 | 160 | −100 | 30 | 30 |
| λ/2 Plate | Material | DLC | DLC | DLC | DLC | DLC | RLC | RLC | RLC |
|  | Re (550 nm) | 250 | 250 | 250 | 250 | 250 | 250 | 250 | 250 |
|  | Rth (550 nm) | −125 | −125 | −125 | −125 | −125 | 125 | 125 | 125 |
|  | Slow Axis Angle | 15 | 15 | 15 | 15 | 15 | 75 | 75 | 75 |
| Second Transparent Support Layer | Material | Cellulose Acylate | Cellulose Acylate | Cellulose Acylate | Cellulose Acylate | Cellulose Acylate | Cellulose Acylate | Cellulose Acylate | Cellulose Acylate |
|  | Re (550 nm) | 0.8 | 0.8 | 0.8 | 0.8 | 0.8 | 0.8 | 0.8 | 0.8 |
|  | RtH (550 nm) | 100 | 210 | −100 | 100 | 100 | −100 | 100 | −150 |
| λ/4 Plate | Material | DLC | DLC | RLC | RLC | RLC | DLC | DLC | RLC |
|  | Re (550 nm) | 125 | 125 | 125 | 125 | 125 | 125 | 125 | 125 |
|  | Rth (550 nm) | −62.5 | −62.5 | 62.5 | 62.5 | 62.5 | −62.5 | −62.5 | 62.5 |
|  | Slow Axis Angle | 75 | 75 | 75 | 75 | 75 | 15 | 15 | 15 |
| Visibility under Bright Light |  | 1 | 1 | 1 | 1 | 1 | 1 | 1 | 1 |

TABLE 12

|  |  | Comparative Example 15 | Comparative Example 16 |
|---|---|---|---|
| Schematic Drawing of Optical Stack |  | Protective Film<br>Polarizer<br>First Transparent Support Layer<br>λ/2 Plate<br>λ/4 Plate<br>Second Transparent Support Layer | |

TABLE 12-continued

|  |  | Comparative Example 15 | Comparative Example 16 |
|---|---|---|---|
| Polarizer Layer | Angle of Absorption Axis | 90 | 90 |
| First Transparent Support Layer | Material | Cellulose Acylate | Cellulose Acylate |
|  | Re (550 nm) | 0.8 | 0.8 |
|  | Rth (550 nm) | −60 | 60 |
| λ/2 Plate | Material | DLC | RLC |
|  | Re (550 nm) | 250 | 250 |
|  | Rth (550 nm) | −125 | 125 |
|  | Slow Axis Angle | 15 | 75 |
| λ/4 Plate | Material | DLC | RLC |
|  | Re (550 nm) | 125 | 125 |
|  | Rth (550 nm) | −62.5 | 62.5 |
|  | Slow Axis Angle | 75 | 15 |
| Second Transparent Support Layer | Material | Cellulose Acylate | Cellulose Acylate |
|  | Re (550 nm) | 0.8 | 0.8 |
|  | Rth (550 nm) | 80 | −50 |
| Visibility under Bright Light |  | 1 | 1 |

TABLE 13

|  |  | Comparative Example 17 | Comparative Example 18 | Comparative Example 19 |
|---|---|---|---|---|
| Schematic Drawing of Optical Stack |  | Protective Film<br>Polarizer<br>λ/2 Plate<br>First Transparent Support Layer<br>λ/4 Plate<br>Second Transparent Support Layer | | |

TABLE 13-continued

| | | Comparative Example 17 | Comparative Example 18 | Comparative Example 19 |
|---|---|---|---|---|
| Polarizer Layer | Angle of Absorption Axis | 90 | 90 | 90 |
| λ/2 Plate | Material | DLC | DLC | RLC |
| | Re (550 nm) | 250 | 250 | 250 |
| | Rth (550 nm) | −125 | −125 | 125 |
| | Slow Axis Angle | 15 | 15 | 75 |
| First Transparent Support Layer | Material | Cellulose Acylate | Cellulose Acylate | Cellulose Acylate |
| | Re (550 nm) | 0.8 | 0.8 | 0.8 |
| | Rth (550 nm) | −60 | 140 | −100 |
| λ/4 Plate | Material | DLC | RLC | DLC |
| | Re (550 nm) | 125 | 125 | 125 |
| | Rth (550 nm) | −62.5 | 62.5 | −62.5 |
| | Slow Axis Angle | 75 | 75 | 15 |
| Second Transparent Support Layer | Material | Cellulose Acylate | Cellulose Acylate | Cellulose Acylate |
| | Re (550 nm) | 0.8 | 0.8 | 0.8 |
| | Rth (550 nm) | 50 | −80 | 60 |
| Visibility under Bright Light | | 1 | 1 | 1 |

TABLE 14

| | Comparative Example 20 |
|---|---|
| Schematic Drawing of Optical Stack | Protective Film Polarizer Cellulose Acylate RLC |
| Polarizer Layer Angle of Absorption Axis | 90 |
| Transparent Support Layer Material | Cellulose Acylate |
| Re (550 nm) | 0.8 |
| Rth (550 nm) | 42 |
| λ/4 Plate Material | RLC |
| Re (550 nm) | 125 |
| Rth (550 nm) | 62.5 |
| Slow Axis Angle | 45 |
| Visibility under Bright Light | 1 |

TABLE 15

| | Comparative Example 21 |
|---|---|
| Schematic Drawing of Optical Stack | Protective Film Polarizer Norbomene |
| Polarizer Layer Angle of Absorption Axis | 90 |
| λ/4 Plate Material | Norbomene |
| Re (550 nm) | 125 |
| Rth (550 nm) | 85 |
| Slow Axis Angle | 45 |
| Visibility under Bright Light | 1 |

It can be seen that the organic EL display device of Examples 1 to 147 which are the organic EL display device according to the invention are excellent in the visibility under bright light in comparison with the organic EL display devices of Comparative Examples 20 and 21 each using a conventional circular polarizing plate or the organic EL display devices of Comparative Examples 1 to 19 in which Rth of the transparent support is not adjusted to an optimal value. The optical stack which is used in the organic EL display device according to the invention is able to be produced in a roll to roll manner, and it is possible to provide the organic EL display device having the excellent antireflection performance in a high yield in addition to in a high productivity and excellent cost resistance. Further, since the optically anisotropic layer containing DLC or RLC hardly exhibits the change in retardation based on the variation of temperature or humidity, in the organic EL display device according to the invention, the change in antireflection performance is not visually recognized in the range of temperature from 0 to 30° C. and humidity from 0 to 90%.

The optical stack according to the invention can be used not only in the organic EL display device but also for the antireflection in a reflection type liquid crystal display device, a semi-transmission type liquid crystal display device, a transparent display or the like. Also, it can be used as a brightness enhancement film by providing on a backlight side of liquid crystal display device. Further, it can also be used as a pick-up for optical disc, a PS conversion element or the like.

INDUSTRIAL APPLICABILITY

According to the invention, an organic EL display device in which the background reflections of reflected image due to internal reflection of the organic EL element is sufficiently reduced not only in the front direction but also in an oblique direction and which is excellent in the display performance, productivity and durability can be provided.

Although the invention has been described in detail and by reference to specific embodiments, it is apparent to those skilled in the art that it is possible to add various alterations and modifications insofar as the alterations and modifications do not deviate from the spirit and the scope of the invention.

This application is based on a Japanese patent application filed on Mar. 15, 2012 (Japanese Patent Application No. 2012-059351) and a Japanese patent application filed on Oct. 4, 2012 (Japanese Patent Application No. 2012-222480), and the contents thereof are incorporated herein by reference.

DESCRIPTION OF REFERENCE NUMERALS AND SIGNS

1 TFT substrate
2 Back electrode
3 Organic layer including light emitting layer
4 Transparent or translucent electrode
5 Transparent substrate
6 Optical stack
7 Polarizing plate

The invention claimed is:

1. An organic EL display device provided with at least a polarizer layer, a λ/2 plate, a λ/4 plate and an organic EL panel in this order, wherein an in-plane retardation $Re2(550)$ of the λ/4 plate at 550 nm satisfies $$115 \leq Re2(550) \leq 155,$$

and an in-plane retardation $Re1(550)$ of the λ/2 plate at 550 nm satisfies $$Re1(550) = 2 \times Re2(550) \pm 50 \text{ nm},$$

wherein, among layers from the polarizer layer to the λ/2 plate, a sum of Rth at a wavelength of 550 nm of all layers including the λ/2 plate and not including the polarizer layer is from −150 to 150 nm, and among layers from the λ/2 plate to the λ/4 plate, a sum of Rth at a wavelength of 550 nm of all layers including the λ/4 plate and not including the λ/2 plate is from −120 to 120 nm.

2. The organic EL display device as claimed in claim 1, wherein an angle formed between an absorption axis direction of the polarizer layer and a slow axis direction of the λ/2 plate is in a range of $-30° \times Rth1(550)/|Rth1(550)| + 45° \pm 8°$, and an angle formed between the absorption axis direction of the polarizer layer and a slow axis direction of the λ/4 plate is in a range of $30° \times Rth1(550)/|Rth1(550)| + 45° \pm 8°$, wherein Rth1(550) represents a retardation in a thickness direction at a wavelength of 550 nm.

3. The organic EL display device as claimed in claim 2, wherein at least one of the λ/2 plate and the λ/4 plate is a layer containing either a discotic liquid crystal compound or a rod-like liquid crystal compound.

4. The organic EL display device as claimed in claim 3, wherein, among layers from the polarizer layer to the λ/2 plate, a sum of Rth at a wavelength of 550 nm of all layers including the λ/2 plate and not including the polarizer layer is from −150 to 150 nm, and among layers from the λ/2 plate to the λ/4 plate, a sum of Rth at a wavelength of 550 nm of all layers including the λ/4 plate and not including the λ/2 plate is from −120 to 120 nm.

5. The organic EL display device as claimed in claim 4, which is provided with at least the polarizer layer, a first transparent support layer made from at least one layer, the λ/2 plate made from a layer containing a discotic liquid crystal compound, a second transparent support layer made from at least one layer, the λ/4 plate made from a layer containing a discotic liquid crystal compound and the organic EL panel in this order, wherein Rth of the first transparent support layer at a wavelength of 550 nm is from −30 to 150 nm, and Rth of the second transparent support layer at a wavelength of 550 nm is from 0 to 200 nm.

6. The organic EL display device as claimed in claim 4, which is provided with at least the polarizer layer, the λ/2 plate made from a layer containing a discotic liquid crystal compound, a transparent support layer made from at least one layer, the λ/4 plate made from a layer containing a discotic liquid crystal compound and the organic EL panel in this order, wherein Rth of the transparent support layer at a wavelength of 550 nm is from −10 to 140 nm.

7. The organic EL display device as claimed in claim 4, which is provided with at least the polarizer layer, a transparent support layer made from at least one layer, the λ/2 plate made from a layer containing a discotic liquid crystal compound, the λ/4 plate made from a layer containing a discotic liquid crystal compound and the organic EL panel in this order, wherein Rth of the transparent support layer at a wavelength of 550 nm is from −30 to 30 nm.

8. The organic EL display device as claimed in claim 4, which is provided with at least the polarizer layer, the λ/2 plate made from a layer containing a discotic liquid crystal compound, the λ/4 plate made from a layer containing a discotic liquid crystal compound, a transparent support layer made from at least one layer and the organic EL panel in this order, wherein Rth of the transparent support layer at a wavelength of 550 nm is from −10 to 100 nm.

9. The organic EL display device as claimed in claim 4, which is provided with at least the polarizer layer, a transparent support layer made from at least one layer, the λ/2 plate made from a layer containing a discotic liquid crystal compound, the λ/4 plate made from a layer containing a rod-like liquid crystal compound and the organic EL panel in this order, wherein Rth of the transparent support layer at a wavelength of 550 nm is from −50 to 150 nm.

10. The organic EL display device as claimed in claim 4, which is provided with at least the polarizer layer, the λ/2 plate made from a layer containing a discotic liquid crystal compound, a transparent support layer made from at least one layer, the λ/4 plate made from a layer containing a rod-like liquid crystal compound and the organic EL panel in this order, wherein Rth of the transparent support layer at a wavelength of 550 nm is from −90 to 50 nm.

11. The organic EL display device as claimed in claim 4, which is provided with at least the polarizer layer, the λ/2 plate made from a layer containing a discotic liquid crystal compound, the λ/4 plate made from a layer containing a rod-like liquid crystal compound, a transparent support layer made from at least one layer and the organic EL panel in this order, wherein Rth of the transparent support layer at a wavelength of 550 nm is from −110 to 40 nm.

12. The organic EL display device as claimed in claim 4, which is provided with at least the polarizer layer, a first transparent support layer made from at least one layer, the λ/2 plate made from a layer containing a discotic liquid crystal compound, a second transparent support layer made from at least one layer, the λ/4 plate made from a layer containing a rod-like liquid crystal compound and the organic EL panel in this order, wherein Rth of the first transparent support layer at a wavelength of 550 nm is from −40 to 140 nm, and Rth of the second transparent support layer at a wavelength of 550 nm is from −70 to 70 nm.

13. The organic EL display device as claimed in claim 4, which is provided with at least the polarizer layer, a first transparent support layer made from at least one layer, the λ/2 plate made from a layer containing a discotic liquid crystal compound, the λ/4 plate made from a layer containing a discotic liquid crystal compound, a second transparent support layer made from at least one layer and the organic EL panel in this order, wherein Rth of the first transparent support layer at a wavelength of 550 nm is from −50 to 130 nm, and Rth of the second transparent support layer at a wavelength of 550 nm is from 0 to 100 nm.

14. The organic EL display device as claimed in claim 4, which is provided with at least the polarizer layer, a first transparent support layer made from at least one layer, the λ/2 plate made from a layer containing a discotic liquid crystal compound, the λ/4 plate made from a layer containing a rod-like liquid crystal compound, a second transparent support layer made from at least one layer and the organic EL panel in this order, wherein Rth of the first transparent support layer at a wavelength of 550 nm is from −40 to 140 nm, and Rth of the second transparent support layer at a wavelength of 550 nm is from −100 to 40 nm.

15. The organic EL display device as claimed in claim 4, which is provided with at least the polarizer layer, the λ/2 plate made from a layer containing a discotic liquid crystal compound, a first transparent support layer made from at least one layer, the λ/4 plate made from a layer containing a discotic liquid crystal compound, a second transparent support layer made from at least one layer and the organic EL panel in this order, wherein Rth of the first transparent support layer at a wavelength of 550 nm is from −40 to 150 nm, and Rth of the second transparent support layer at a wavelength of 550 nm is from −50 to 100 nm.

16. The organic EL display device as claimed in claim 4, which is provided with at least the polarizer layer, the λ/2 plate made from a layer containing a discotic liquid crystal compound, a first transparent support layer made from at least one layer, the λ/4 plate made from a layer containing a rod-like liquid crystal compound, a second transparent support layer made from at least one layer and the organic EL panel in this order, wherein Rth of the first transparent support layer at a wavelength of 550 nm is from −70 to 100 nm, and Rth of the second transparent support layer at a wavelength of 550 nm is from −110 to 40 nm.

17. The organic EL display device as claimed in claim 4, which is provided with at least the polarizer layer, a transparent support layer made from at least one layer, the λ/2 plate made from a layer containing a rod-like liquid crystal compound, the λ/4 plate made from a layer containing a discotic liquid crystal compound and the organic EL panel in this order, wherein Rth of the transparent support layer at a wavelength of 550 nm is from −150 to 50 nm.

18. The organic EL display device as claimed in claim 4, which is provided with at least the polarizer layer, a transparent support layer made from at least one layer, the λ/2 plate made from a layer containing a rod-like liquid crystal compound, the λ/4 plate made from a layer containing a rod-like liquid crystal compound and the organic EL panel in this order, wherein Rth of the transparent support layer at a wavelength of 550 nm is from −30 to 30 nm.

19. The organic EL display device as claimed in claim 4, which is provided with at least the polarizer layer, the λ/2 plate made from a layer containing a rod-like liquid crystal compound, a transparent support layer made from at least one layer, the λ/4 plate made from a layer containing a discotic liquid crystal compound and the organic EL panel in this order, wherein Rth of the transparent support layer at a wavelength of 550 nm is from −50 to 90 nm.

20. The organic EL display device as claimed in claim 4, which is provided with at least the polarizer layer, the λ/2 plate made from a layer containing a rod-like liquid crystal compound, a transparent support layer made from at least one layer, the λ/4 plate made from a layer containing a rod-like liquid crystal compound and the organic EL panel in this order, wherein Rth of the transparent support layer at a wavelength of 550 nm is from −140 to 10 nm.

21. The organic EL display device as claimed in claim 4, which is provided with at least the polarizer layer, the λ/2 plate made from a layer containing a rod-like liquid crystal compound, the λ/4 plate made from a layer containing a discotic liquid crystal compound, a transparent support layer made from at least one layer and the organic EL panel in this order, wherein Rth of the transparent support layer at a wavelength of 550 nm is from −50 to 110 nm.

22. The organic EL display device as claimed in claim 4, which is provided with at least the polarizer layer, the λ/2 plate made from a layer containing a rod-like liquid crystal compound, the λ/4 plate made from a layer containing a rod-like liquid crystal compound, a transparent support layer made from at least one layer and the organic EL panel in this order, wherein Rth of the transparent support layer at a wavelength of 550 nm is from −100 to 10 nm.

23. The organic EL display device as claimed in claim 4, which is provided with at least the polarizer layer, a first transparent support layer made from at least one layer, the λ/2 plate made from a layer containing a rod-like liquid crystal compound, a second transparent support layer made from at least one layer, the λ/4 plate made from a layer containing a discotic liquid crystal compound and the organic EL panel in this order, wherein Rth of the first transparent support layer at a wavelength of 550 nm is from −140 to 40 nm, and Rth of the second transparent support layer at a wavelength of 550 nm is from −70 to 70 nm.

24. The organic EL display device as claimed in claim 4, which is provided with at least the polarizer layer, a first transparent support layer made from at least one layer, the λ/2 plate made from a layer containing a rod-like liquid crystal compound, a second transparent support layer made from at least one layer, the λ/4 plate made from a layer containing a rod-like liquid crystal compound and the organic EL panel in this order, wherein Rth of the first transparent support layer at a wavelength of 550 nm is from −150 to 40 nm, and Rth of the second transparent support layer at a wavelength of 550 nm is from −200 to 0 nm.

25. The organic EL display device as claimed in claim 4, which is provided with at least the polarizer layer, a first transparent support layer made from at least one layer, the λ/2 plate made from a layer containing a rod-like liquid crystal compound, the λ/4 plate made from a layer containing a discotic liquid crystal compound, a second transparent support layer made from at least one layer and the organic EL panel in this order, wherein Rth of the first transparent support layer at a wavelength of 550 nm is from −140 to 40 nm, and Rth of the second transparent support layer at a wavelength of 550 nm is from −40 to 100 nm.

26. The organic EL display device as claimed in claim 4, which is provided with at least the polarizer layer, a first transparent support layer made from at least one layer, the λ/2 plate made from a layer containing a rod-like liquid crystal compound, the λ/4 plate made from a layer containing a rod-like liquid crystal compound, a second transparent support layer made from at least one layer and the organic EL panel in this order, wherein Rth of the first transparent support layer at a wavelength of 550 nm is from −120 to 40 nm, and Rth of the second transparent support layer at a wavelength of 550 nm is from −100 to 0 nm.

27. The organic EL display device as claimed in claim 4, which is provided with at least the polarizer layer, the λ/2 plate made from a layer containing a rod-like liquid crystal compound, a first transparent support layer made from at least one layer, the λ/4 plate made from a layer containing a discotic liquid crystal compound, a second transparent support layer made from at least one layer and the organic EL panel in this order, wherein Rth of the first transparent support layer at a wavelength of 550 nm is from −100 to 80 nm, and Rth of the second transparent support layer at a wavelength of 550 nm is from −40 to 100 nm.

28. The organic EL display device as claimed in claim 4, which is provided with at least the polarizer layer, the λ/2 plate made from a layer containing a rod-like liquid crystal compound, a first transparent support layer made from at least one layer, the λ/4 plate made from a layer containing a rod-like liquid crystal compound, a second transparent support layer made from at least one layer and the organic EL panel in this order, wherein Rth of the first transparent support layer at a wavelength of 550 nm is from −150 to 40 nm, and Rth of the second transparent support layer at a wavelength of 550 nm is from −100 to 50 nm.

29. The organic EL display device as claimed in claim 1, which comprises at least one cellulose acylate layer between the polarizer layer and the organic EL panel.

\* \* \* \* \*